US010692547B2

(12) United States Patent
Jamali et al.

(10) Patent No.: US 10,692,547 B2
(45) Date of Patent: Jun. 23, 2020

(54) SELF-REFERENCING SENSING SCHEMES WITH COUPLING CAPACITANCE

(71) Applicant: Micron Technology, Inc., Boise, ID (US)

(72) Inventors: Mahdi Jamali, Folsom, CA (US); William A. Melton, Shingle Springs, CA (US); Daniele Vimercati, El Dorado Hills, CA (US); Xinwei Guo, Folsom, CA (US); Yasuko Hattori, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/746,613

(22) Filed: Jan. 17, 2020

(65) Prior Publication Data

US 2020/0152243 A1 May 14, 2020

Related U.S. Application Data

(60) Continuation of application No. 16/512,963, filed on Jul. 16, 2019, now Pat. No. 10,573,355, which is a
(Continued)

(51) Int. Cl.
*G11C 7/06* (2006.01)
*G11C 7/08* (2006.01)
(Continued)

(52) U.S. Cl.
CPC .............. *G11C 7/065* (2013.01); *G11C 7/08* (2013.01); *G11C 11/2273* (2013.01); *G11C 11/4091* (2013.01)

(58) Field of Classification Search
CPC .................................................. G11C 7/065
(Continued)

(56) References Cited

U.S. PATENT DOCUMENTS 6,459,609 B1 10/2002 Du
8,164,362 B2 * 4/2012 Afghahi .................. G11C 7/06
327/51

(Continued)

OTHER PUBLICATIONS

IPO, "Office Action," issued in connection with ROC (Taiwan) Patent Application No. 107108103432, dated Oct. 23, 2019 (19 pages).

(Continued)

*Primary Examiner* — Jason Lappas
(74) *Attorney, Agent, or Firm* — Holland & Hart LLP

(57) ABSTRACT

Methods, systems, and devices for self-referencing sensing schemes with coupling capacitance are described. A sense component of a memory device may include a capacitive coupling between two nodes of the sense component. The capacitive coupling may, in some examples, be provided by a capacitive element of the sense component or an intrinsic capacitance between features of the sense component. An example of a method employing such a sense component for detecting a logic state stored by a memory cell may include generating a first sense signal at one of the nodes while the node is coupled with the memory cell, and generating a second sense signal at the other of the nodes while the other node is coupled with the memory cell. The sense signals may be based at least in part on the capacitive coupling between the two nodes.

20 Claims, 12 Drawing Sheets

Related U.S. Application Data division of application No. 15/892,118, filed on Feb. 8, 2018, now Pat. No. 10,395,697.

(51) Int. Cl.
*G11C 11/4091* (2006.01)
*G11C 11/22* (2006.01)

(58) Field of Classification Search
USPC .......................................... 365/185.21, 196
See application file for complete search history.

(56) References Cited

U.S. PATENT DOCUMENTS

| | | |
|---|---|---|
| 9,858,979 B1 | 1/2018 | Derner et al. |
| 2012/0170348 A1 | 7/2012 | Clinton et al. |
| 2012/0307545 A1 | 12/2012 | McAdams et al. |
| 2014/0085992 A1 | 3/2014 | Thompson et al. |
| 2017/0345509 A1 | 11/2017 | Tran et al. |

OTHER PUBLICATIONS

ISA/KR, International Search Report and Written Opinion of the International Searching Authority, Int'l Appl. No. PCT/US2019/015083, dated May 10, 2019, Korean Intellectual Property Office, Seo-gu, Daejeon, Republic of Korea, 10 pgs.

\* cited by examiner

10,692,547 B2

SELF-REFERENCING SENSING SCHEMES WITH COUPLING CAPACITANCE

CROSS REFERENCES

The present Application for Patent is a continuation of U.S. patent application Ser. No. 16/512,963 by Jamali et al., entitled "Self-Referencing Sensing Schemes with Coupling Capacitance," filed Jul. 16, 2019, which is a divisional of U.S. patent application Ser. No. 15/892,118 by Jamali et al., entitled "Self-Referencing Sensing Schemes with Coupling Capacitance," filed Feb. 8, 2018, granted as U.S. Pat. No. 10,395,697, each of which is assigned to the assignee hereof, and each of which is expressly incorporated by reference in its entirety herein.

BACKGROUND

The following relates generally to memory systems and more specifically to self-referencing sensing schemes with coupling capacitance.

Memory devices are widely used to store information in various electronic devices such as computers, wireless communication devices, cameras, digital displays, and the like. Information is stored by programing different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices exist, including those that employ magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

Improving memory devices, may include increasing memory cell density, increasing read/write speeds, increasing reliability, increasing data retention, reducing power consumption, or reducing manufacturing costs, among other metrics. In some cases, a reference voltage for reading a memory cell may be provided by a reference voltage source that is shared among many memory cells. In such cases, operations (e.g., read operations) may be sensitive to variations between one memory cell and another, and the memory device may be associated with relatively low sensing margins or be otherwise sensitive to read errors. In some cases, accessing a memory cell with a self-referencing sensing scheme may require several access operations on the memory cell to provide suitable reference signals for each of the potential logic states of the memory cell. Such sensing operations may be associated with relatively slow memory cell access times, or relatively high power consumption.

DETAILED DESCRIPTION

Figure 1:
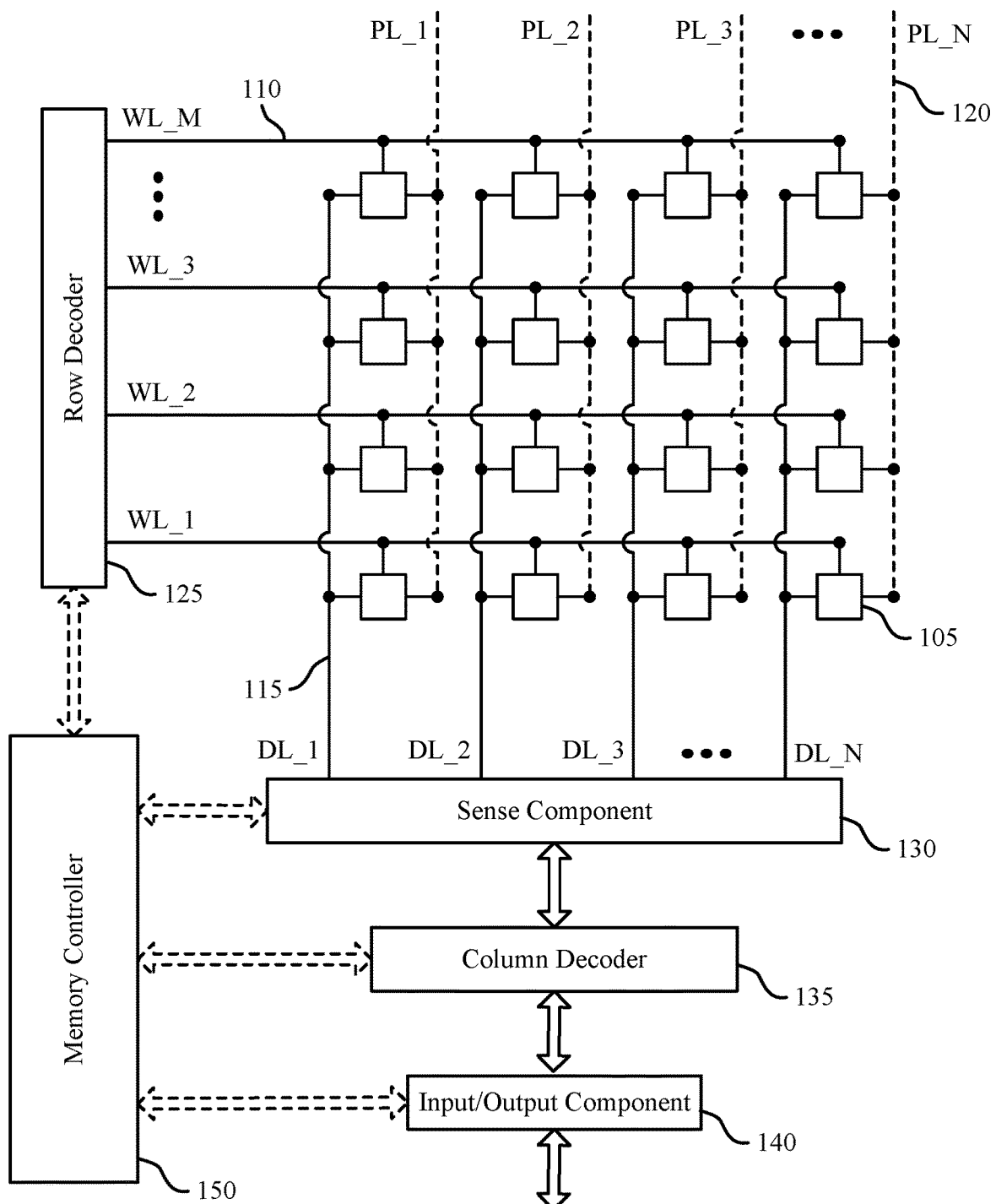
FIG. 1 illustrates an example memory device that supports self-referencing sensing schemes with coupling capacitance in accordance with examples of the present disclosure.

The logic state of a memory cell may be read by employing self-referencing sensing schemes with coupling capacitance in accordance with aspects of the present disclosure. For example, a memory cell may be accessed a first time (e.g., to generate a sense signal), with the resulting signal being generated at a first node or terminal of a sense component. The same memory cell may be accessed a second time (e.g., after the first time and to generate a reference signal), with the resulting signal generated at a second node or terminal of the sense component. The first and second nodes may be capacitively coupled with one another (e.g., by a capacitor element of the sense component or by an intrinsic capacitance configured between subcomponents of the sense component), such that a signal generated at the first node and the signal generated at the second node may interact with one another. In other words, a signal generated at the first node may cause a change (e.g., a change in voltage or a change in charge) at the second node, and a signal generated at the second node may cause a change (e.g., a change in voltage or a change in charge) at the first node. The resulting signals at the nodes of the sense component may be analyzed (e.g., compared) to determine a logic state originally stored in the memory cell.

As one example, as applied to a ferroelectric memory cell, self-referencing read operations using a positive sense voltage for sensing a positively polarized memory cell may store a displacement signal at both the first node and second node of the sense component. On the other hand, self-referencing read operations using a positive sense voltage for sensing a negatively polarized memory cell may store a displacement and polarization signal at the first terminal of the sense component, and a displacement signal at the second terminal of the sense component. In various sensing schemes, the difference, or lack thereof, between signals generated by the first and second accessing of the same memory cell (e.g., a difference in generated voltage or a difference in generated charge) may be used to determine the logic state originally stored in the memory cell. Because the same memory cell is accessed for both a sense signal and a reference signal, effects due to circuit path resistance, intrinsic capacitance, component behavior, and component variation, and the like may be mitigated or cancelled between the first and second sensing (e.g., because the effects may be the same, or substantially same, during the first and second sensing of the same memory cell).

In examples where access operations do not change a state (e.g., a charge state, a polarization state, or a resistance state) of a memory cell, a self-referencing read operation may generate a sense signal (e.g., by a first access operation) and generate a reference signal (e.g., by a second access operation) that is similar to (e.g., substantially the same as) the sense signal. Certain sense components may rely on a difference between a sense signal and a reference signal to detect a stored logic state in a memory cell, however. For such sense components, the result of detecting a logic state with such a self-referencing read operation (e.g., where a sense signal and a reference signal are similar or substantially identical) may be indeterminate. In other words, such a sense component may not be able to determine a logic state stored by a memory cell because a difference between the sense signal and reference signal is too small, or because any detected difference between the sense signal and the reference signal may be related to factors other than the logic state originally stored in the memory cell (e.g., signal noise, signal tolerance, or other operational variations), and would therefore be prone to read errors. These issues may be overcome in some examples by a read operation that includes generating multiple reference signals (e.g., reading a memory cell multiple times to generate reference signals corresponding to multiple logic states), but such operations may be relatively slow, or be associated with relatively high power consumption.

In accordance with examples of the present disclosure, a sense component may include a capacitive coupling between a first node of a sense component and a second node of the sense component (e.g., a capacitance between the first node and the second node). The capacitive coupling may be a capacitor element of the sense component, or may be an intrinsic capacitance between elements of the sense component (e.g., an intrinsic capacitance configured between two amplifiers of the sense component). By configuring a sense component with such a capacitive coupling, a signal generated at the first node may affect a signal generated at the second node, and vice versa. As described herein, the effect provided by such a capacitive coupling may enable the use of read operations for self-referencing that would, for example, be otherwise indeterminate.

For example, to detect a logic state stored by a memory cell with such a self-referencing read operation, a first signal may be generated at the first node by accessing the memory cell with a first access operation (e.g., while the memory cell or associated access line is coupled with the first node). A second signal may be generated at the second node by accessing the memory cell with a second access operation (e.g., while the memory cell or associated access line is coupled with the second node). As supported by the capacitive coupling between the first node and the second node, the second signal may be based at least in part on the first signal and the capacitive coupling. For example, the second signal may have a higher or lower charge or voltage than if the first signal was not present at the first node, or if the sense component did not include a capacitive coupling between the first node and the second node.

Additionally or alternatively, generating the second signal at the second node may change the signal at the first node (e.g., changing a voltage at the first node or changing a state of charge at the first node). Thus, in examples of access operations that would otherwise result in similar (e.g., substantially equal) signals, the capacitive coupling described herein may cause the signals at the first and second nodes of the sense component to be sufficiently different (e.g., at a time when the signals at the first node and the second node are used in a read operation to detect a logic state), and such a difference may be leveraged by the sense component to detect the logic state originally stored at the memory cell.

In one example, an apparatus in accordance with the present disclosure may include a memory cell, an input/output component, and a sense component coupled with the memory cell and the input/output component. The sense component may include a sense amplifier, a first node coupled with or between the sense amplifier and the memory cell, and a second node coupled with or between the sense amplifier and the memory cell, where the second node is capacitively coupled with the first node. The sense component may be configured to determine a logic state of the memory cell based at least in part on a signal at the first node and a signal at the second node.

In some examples, the sense component further includes a first switching component coupled with or between the first node and the second node. The first switching component may be configured to selectively adjust the capacitive coupling of the second node with the first node, such as enabling, disabling, or otherwise adjusting an degree of the capacitive coupling.

In some examples, the second node is capacitively coupled with the first node through a capacitor element of the sense component. In some examples, the second node is capacitively coupled with the first node through an intrinsic capacitance between a first amplifier of the sense amplifier and a second amplifier of the sense amplifier, the intrinsic capacitance configured to capacitively couple the first node with the second node.

In some examples, the apparatus further includes a second switching component coupled with or between the memory cell and the first node. The second switching component may be configured to selectively couple the memory cell with the first node. In some examples, the apparatus further includes a third switching component coupled with or between the memory cell and the second node. The third switching component may be configured to selectively couple the memory cell with the second node.

In some examples, the first node may be capacitively coupled with a ground voltage source. Additionally or alternatively, in some examples, the second node is capacitively coupled with a ground voltage source.

In another example, a method in accordance with the present disclosure may include performing a read operation on a memory cell, which may be coupled with a first access line and a second access line. The method may include generating a first sense signal at a first node of a sense amplifier while the first node of the sense amplifier is coupled with a memory cell, and generating a second sense signal at a second node of the sense amplifier while the second node of the sense amplifier is coupled with the memory cell. The second sense signal may be based at least in part on the first sense signal and a capacitive coupling between the first node of the sense amplifier and the second node of the sense amplifier. For example, generating the second sense signal at the second node of the sense amplifier may cause a change in voltage at the first node of the sense amplifier.

The method may further include determining a logic state stored by the memory cell based at least in part on generating the first sense signal and generating the second sense signal. For example, determining the logic state stored by the memory cell may include comparing a voltage of the first node of the sense amplifier with a voltage of the second node of the sense amplifier.

In some examples, generating the first sense signal includes building a first charge along an access line that is coupled with or between the memory cell and the sense amplifier, and the first charge is based at least in part on a charge stored at the memory cell that corresponds to the logic state stored by the memory cell. In some examples, generating the second sense signal includes building a second charge along an access line that is coupled with or between the memory cell and the sense amplifier, and the second charge is based at least in part on a charge stored at the memory cell that corresponds to a reference state stored by the memory cell.

In some examples, generating the first sense signal includes activating a first switching component that is coupled with or between the first node of the sense amplifier and the memory cell, the first switching component configured to selectively couple the first node of the sense amplifier and the memory cell. In some examples, the method includes deactivating the first switching component after generating the first sense signal and before generating the second sense signal.

In some examples, generating the second sense signal includes activating a second switching component that is coupled with or between the second node of the sense amplifier and the memory cell, the second switching component configured to selectively couple the second node of the sense amplifier and the memory cell. In some examples, the second switching component is deactivated during the generating of the first sense signal.

In some examples, the method includes deactivating a third switching component after generating the second sense signal and before determining the logic state stored by the memory cell, the third switching component coupled with or between the capacitive coupling and one of the first node of the sense amplifier or the second node of the sense amplifier. The third switching component may be configured to selectively couple the capacitive coupling and the one of the first node of the sense amplifier or the second node of the sense amplifier.

In another example, an apparatus in accordance with the present disclosure includes a sense component in electronic communication with a memory cell via a first access line, a capacitance between a first node of the sense component and a second node of the sense component, and a controller in electronic communication with the sense component and the memory cell. The controller may be operable to cause the apparatus to generate a first sense signal at the first node of the sense component while the memory cell is coupled with the first node of the sense component, and generate a second sense signal at the second node of the sense component while the memory cell is coupled with the second node of the sense component. The second sense signal may be based at least in part on the generated first sense signal and the capacitance between the first node of the sense component and the second node of the sense component. For example, generating the second sense signal at the second node of the sense component may cause a change in voltage at the first node of the sense component.

The controller may also be operable to cause the apparatus to determine a logic state stored by the memory cell based at least in part on generating the first sense signal and generating the second sense signal. In some examples, determining the logic state stored by the memory cell includes comparing a voltage of the first node of the sense component with a voltage of the second node of the sense component.

In some examples, generating the first sense signal includes building a first charge along an access line that is coupled with or between the memory cell and the sense component, where the first charge is based at least in part on a charge stored at the memory cell that corresponds to the logic state stored by the memory cell. In some examples, generating the second sense signal includes building a second charge along an access line that is coupled with or between the memory cell and the sense component, where the second charge is based at least in part on a charge stored at the memory cell that corresponds to a reference state stored by the memory cell.

Features of the disclosure introduced above are further described with respect to FIGS. 1 through 4 in the context of memory arrays, memory circuits, and memory cell behaviors that support self-referencing sensing schemes with coupling capacitance. Specific examples are then described with respect to FIGS. 5 through 6B, which illustrate a particular circuit with associated read operation timing diagrams that support self-referencing sensing schemes with coupling capacitance. These and other features of the disclosure are further described with respect to FIGS. 7 through 11, which illustrate apparatus diagrams, system diagrams, and flowcharts that support self-referencing sensing schemes with coupling capacitance.

FIG. 1 illustrates an example memory device 100 that supports self-referencing sensing schemes with coupling capacitance in accordance with various embodiments of the present disclosure. Memory device 100 may also be referred to as an electronic memory apparatus. Memory device 100 includes memory cells 105 that are programmable to store different logic states. In some cases, a memory cell 105 may be programmable to store two logic states, denoted a logic 0 and a logic 1. In some cases, a memory cell 105 may be programmable to store more than two logic states. In various examples, the memory cells 105 may include a capacitive memory element, a ferroelectric memory element, a resistive element, or a self-selecting memory (e.g., SSM) element.

In some examples, a memory cell 105 may store an electric charge representative of the programmable logic states (e.g., storing charge in a capacitor). In one example, a charged and uncharged capacitor may represent two logic states, respectively. In another example, a positively and negatively charged capacitor may represent two logic states, respectively. DRAM or FeRAM architectures may use such designs, and the capacitor employed may include a dielectric material with linear or para-electric electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element, that has a variable and configurable electrical resistance representative of different logic states.

For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, or a collection of a relatively large crystal grains that is substantially crystalline) may have a relatively low electrical resistance, and may alternatively be referred to as a "SET" logic state. A more-amorphous state of the material (e.g., an entirely amorphous state, or some distribution of relatively small crystal grains that is substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceed across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. In some cases, a material in both the more-amorphous state and the more-crystalline state may be associated with threshold voltages. For example, SSM may enhance differences in a threshold voltage of the memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., "decks" or "levels") are formed on top of one another. Such an arrangement may increase the number of memory cells 105 that may be placed or created on a single die or substrate as compared with 2D arrays, which in turn may reduce production costs or increase the performance of a memory device 100, or both. The decks may be separated by an electrically insulating material. Each deck or level may be aligned or positioned so that memory cells 105 may be approximately aligned with one another across each deck, forming a stack of memory cells 105.

In the example of memory device 100, each row of memory cells 105 is coupled with one of a plurality of first access lines 110 (e.g., a word line (WL), such as one of WL_1 through WL_M), and each column of memory cells 105 is coupled with one of a plurality of second access lines 115 (e.g., a digit line (DL), such as one of DL_1 through DL_N). In some cases, first access lines 110 and second access lines 115 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with or between) an access line 110 and an access line 115. This intersection may be referred to as an address of a memory cell 105. A target memory cell 105 may be a memory cell 105 located at the intersection of an energized or otherwise selected access line 110 and an energized or otherwise selected access line 115. In other words, an access line 110 and an access line 115 may be energized or otherwise selected to access (e.g., read or write) a memory cell 105 at their intersection. Other memory cells 105 that are in electronic communication with (e.g., connected to) the same access line 110 or 115 may be referred to as untargeted memory cells 105.

Although the access lines described with reference to FIG. 1 are shown as direct lines between memory cells 105 and coupled components, access lines may include other circuit elements, such as capacitors, resistors, transistors, amplifiers, and others, which may be used to support access operations including those described herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

In some architectures, the logic storing component (e.g., a capacitive memory element, a ferroelectric memory element, a resistive memory element, or other memory element) of a memory cell 105 may be electrically isolated from a second access line 115 by a selection component. A first access line 110 may be coupled with and may control the selection component of the memory cell 105. For example, the selection component may be a transistor and the first access line 110 may be coupled with a gate of the transistor. Activating the first access line 110 of a memory cell 105 may result in an electrical connection or closed circuit between the logic storing component of the memory cell 105 and its corresponding second access line 115. The second access line 115 may then be accessed to read or write the memory cell 105.

In some examples, memory cells 105 may also be coupled with one of a plurality of third access lines 120 (e.g., a plate line (PL), such as one of PL_1 through PL_N). In some examples, the plurality of third access lines 120 may couple memory cells 105 with a voltage source for various sensing and/or writing operations including those described herein. For example, when a memory cell 105 employs a capacitor for storing a logic state, a second access line 115 may provide access to a first terminal of the capacitor, and a third access line 120 may provide access to a second terminal of the capacitor. Although the plurality of third access lines 120 of the memory device 100 are shown as substantially parallel with the plurality of second access lines 115, in other examples a plurality of third access lines 120 may be substantially parallel with the plurality of first access lines 110, or in any other configuration.

Access operations such as reading, writing, and rewriting may be performed on a memory cell 105 by activating or selecting a first access line 110, a second access line 115, and/or a third access line 120 coupled with the memory cell 105, which may include applying a voltage, a charge, or a current to the respective access line. Access lines 110, 115, and 120 may be made of conductive materials, such as metals (e.g., copper (Cu), silver (Ag), aluminum (Al), gold (Au), tungsten (W), or titanium (Ti)), metal alloys, carbon, or other conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line and/or resulting voltage of an access line may be detected to determine the programmed logic state stored by the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples, a memory cell 105 may be accessed by activating a first access line 110 and a second access line 115.

In some examples, the memory controller 150 may control the operation (e.g., read operations, write operations, rewrite operations, refresh operations, or discharge operations) of memory cells 105 through the various components (e.g. row decoder 125, column decoder 135, and sense component 130). In some cases, one or more of the row decoder 125, column decoder 135, and sense component 130 may be co-located or otherwise included with the memory controller 150. Memory controller 150 may generate row and column address signals to activate a desired access line 110 and access line 115. Memory controller 150 may also generate or control various voltages or currents used during the operation of memory device 100. For example, the memory controller 150 may apply a discharge voltage to a access line 110 or access line 115 after accessing one or more memory cells 105.

In general, the amplitude, shape, or duration of an applied voltage, current, or charge in accordance with the present disclosure may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read (e.g., sensed) by sense component 130 when the memory cell 105 is accessed to determine the stored state of the memory cell 105 (e.g., in cooperation with the memory controller 150). For example, after accessing the memory cell 105, the logic storage portion of memory cell 105 may discharge, or otherwise permit electrical charge or current to flow via its corresponding access line 115. Such charge or current may result from biasing, or applying a voltage, to the memory cell 105 from one or more voltage sources or supplies (not shown) of the memory device 100, where such voltage sources or supplies may be part of the sense component 130, the memory controller 150, or some other component (e.g., a biasing component). In some examples, a discharge of a memory cell 105 may cause a change in the voltage of the access line 115, which the sense component 130 may compare to a reference voltage to determine the stored state of the memory cell 105. In some examples, a voltage may be applied to a memory cell 105 (e.g., using the corresponding access line 110 and access line 115) and the presence of a resulting current may depend on the applied voltage and the resistance state of a memory element of the memory cell 105.

In some cases, more than one voltage may be applied when reading a memory cell 105 (e.g., multiple voltages of a read operation). For example, if an applied read voltage does not result in current flow, other read voltages may be applied until a current is detected by sense component 130. By assessing the read voltage that resulted in current flow, the stored logic state of the memory cell 105 may be determined. In some cases, a read voltage may be ramped higher in magnitude until a current flow is detected by sense component 130. In other cases, predetermined read voltages may be applied sequentially until a current is detected. Likewise, a read current may be applied to a memory cell 105 and the magnitude of the voltage to create the read current may depend on the electrical resistance or the total threshold voltage of the memory cell 105.

Sense component 130 may include various switching components, transistors, or amplifiers to detect and amplify a difference in read signals (e.g., a read voltage, a read current, or a read charge shared between components of the memory device 100), which, in some examples, may be referred to as latching. The sense component 130 may be configured to sense the current or charge through the memory cell 105 responsive to a read operation and provide an output signal indicative of the logic state stored by the memory cell 105. The sense component 130 may be included in a memory device that includes the memory device 100. For example, the sense component 130 may be included with other read and write circuits, decoding circuits, or register circuits of the memory that may be coupled to the memory device 100. In some examples, the detected logic state of memory cell 105 may be output through column decoder 135 as an output. In some examples, a sense component 130 may be part of a column decoder 135 or row decoder 125. In some examples, a sense component 130 may be connected to or otherwise in electronic communication with column decoder 135 or row decoder 125.

In some examples, when a read pulse (e.g., a read voltage) is applied across a memory cell 105 with a memory element storing a first logic state (e.g., a SET state, associated with a more-crystalline atomic configuration), the memory cell conducts current due to the read pulse exceeding a threshold voltage of the memory cell 105. In response or based on this, the sense component 130 may therefore detect a current through the memory cell 105 as part of determining the stored logic state. When a read pulse is applied to the memory cell 105 with the memory element storing a second logic state (e.g., a RESET state, associated with an more-amorphous atomic configuration), which may occur before or after the application of a read pulse across a memory cell 105 with a memory element storing a first logic state, the memory cell may not conduct current due to the read pulse not exceeding the threshold voltage of the memory cell. The sense component 130 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some memory architectures, accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row or all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 110, second access line 115, and/or third access line 120—e.g., a logic state may be stored in the memory cell 105. Column decoder 135 or row decoder 125 may accept data, for example via input/output component 140, to be written to the memory cells 105. In the case of a capacitive memory element, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding or virtually grounding the ferroelectric memory element). In the case of PCM, a memory element may be written by applying a current with a profile that causes (e.g., by way of heating and cooling) the memory element to form an atomic configuration associated with a desired logic state.

In various examples in accordance with the present disclosure, a sense component 130 may have a first node and a second node, and a capacitive coupling between the first node and the second node, such as a capacitor element (e.g., a capacitor) or an intrinsic capacitance configured between subcomponents of the sense component 130. The sense component 130 may determine a logic state stored by a memory cell by comparing signals at the first node and the second node. The capacitive coupling may enable signals generated at the first node to affect the second node, and signals generated at the second node to affect the first node.

For example, in certain self-referencing read operations, a sense signal may be generated or otherwise developed from a memory cell at the first node in a first access operation, and a reference signal may be generated or otherwise developed from the same memory cell at the second node in a second access operation different from the first access operation. If the sense signal and the reference signal are similar (e.g., substantially identical), such as when the first access operation does not substantially change the storage characteristic of the memory cell 105, the signals at the first node and the second node may also be similar (e.g., substantially identical). This similarity, in some examples, may not enable the sense component 130 to detect the logic state stored by the memory cell. However, as further illustrated herein, a sense component 130 having a capacitive coupling in accordance with the present disclosure may employ such a coupling to alter the behavior at the first node when generating the signal at the second node, or to alter the behavior at the second node when generating the signal at the first node, or both, thereby supporting the sense component 130 detecting the logic state stored by the memory cell.

Accordingly, a capacitive coupling between the first node and the second node may enable a sense component 130 to be employed in self-referencing read operations that include access operations (e.g., sub-operations) that may generate similar (e.g., substantially identical) signals. More specifically, a read operation may include generating a sense signal at the first node, and generating a reference signal at the second node in such a manner that affects the signal at the first node. Such an effect may enable a sense component to detect a difference in signals between the first node and the second node, even when the access operations themselves may be associated with substantially the same signal.

Figure 2:
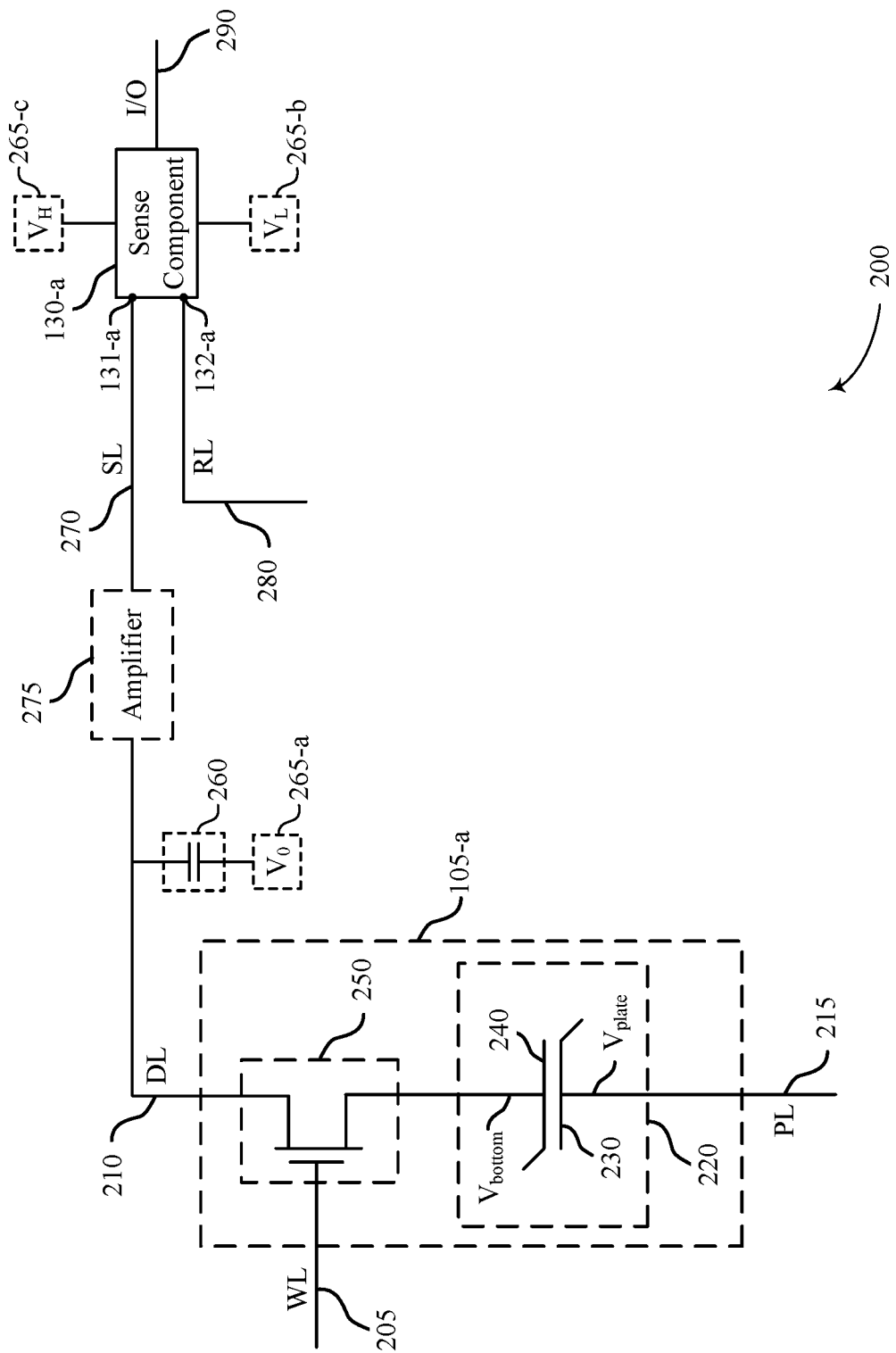
FIG. 2 illustrates an example circuit that supports self-referencing sensing schemes with coupling capacitance in accordance with examples of the present disclosure.

FIG. 2 illustrates an example circuit 200 that supports self-referencing sensing schemes with coupling capacitance in accordance with various embodiments of the present disclosure. Circuit 200 includes a memory cell 105-a and a sense component 130-a, which may be examples of a memory cell 105 and a sense component 130 described with reference to FIG. 1. Circuit 200 may also include a word line 205, a digit line 210, and a plate line 215, which, in some examples, may correspond to a first access line 110, a second access line 115, and a third access line 120, respectively, as described with reference to FIG. 1. The circuit 200 may also include a reference line 280 used by the sense component 130-a to determine a stored logic state of the memory cell 105-a. As illustrated in FIG. 2, the sense component 130-a may include a first node 131-a and a second node 132-a, which in various examples may be coupled with different access lines of a circuit (e.g., signal line 270 and reference line 280 of circuit 200, respectively) or a common access line of a different circuit (not shown). However, other configurations of access lines and/or reference lines are possible in accordance with various embodiments of the present disclosure.

Memory cell 105-a may include a logic storage component (e.g., a memory element), such as capacitor 220 that has a first plate, cell plate 230, and a second plate, cell bottom 240. Cell plate 230 and cell bottom 240 may be capacitively coupled through a dielectric material positioned between them (e.g., in a DRAM application), or capacitively coupled through a ferroelectric material positioned between them (e.g., in a FeRAM application). Cell plate 230 may be associated with a voltage $V_{plate}$, and cell bottom may be associated with a voltage $V_{bottom}$, as illustrated in circuit 200. The orientation of cell plate 230 and cell bottom 240 may be different (e.g., flipped) without changing the operation of memory cell 105-a. Cell plate 230 may be accessed via plate line 215 and cell bottom 240 may be accessed via digit line 210. As described herein, various states may be stored by charging, discharging, and/or polarizing the capacitor 220.

Capacitor 220 may be in electronic communication with digit line 210, and the stored logic state of capacitor 220 may be read or sensed by operating various elements represented in circuit 200. For example, the memory cell 105-a may also include a selection component 250, and the capacitor 220 can be coupled with digit line 210 when selection component 250 is activated, and the capacitor 220 can be isolated from digit line 210 when selection component 250 is deactivated.

Activating selection component 250 may be referred to as selecting memory cell 105-a in some examples, and deactivating selection component 250 may be referred to as deselecting memory cell 105-a in some examples. In some cases, selection component 250 is a transistor and its operation is controlled by applying an activation voltage to the transistor gate, where the voltage for activating the transistor (e.g., the voltage between the transistor gate terminal and the transistor source terminal) is greater than the threshold voltage magnitude of the transistor. The word line 205 may be used to activate the selection component 250. For example, a selection voltage applied to the word line 205 (e.g., a word line logic signal) may be applied to the gate of a transistor of selection component 250, which may connect capacitor 220 with the digit line 210 (e.g., providing a conductive path between the capacitor 220 and the digit line 210.

In other examples, the positions of the selection component 250 and the capacitor 220 in the memory cell 105-a may be switched, such that selection component 250 is coupled between plate line 215 and cell plate 230, and the capacitor 220 is coupled between digit line 210 and the other terminal of selection component 250. In such an embodiment, the selection component 250 may remain in electronic communication with digit line 210 through capacitor 220. This configuration may be associated with alternative timing and biasing for access operations.

In examples that employ a ferroelectric capacitor 220, the capacitor 220 may or may not fully discharge upon connection to digit line 210. In various schemes, to sense the logic state stored by a ferroelectric capacitor 220, a voltage may be applied to plate line 215 and/or digit line 210, and the word line 205 may be biased to select memory cell 105-a. In some cases, the plate line 215 and/or digit line 210 may be virtually grounded and then isolated from the virtual ground, which may be referred to as a floating condition, prior activating the word line 205.

Operation of the memory cell 105-a by varying the voltage to cell plate 230 (e.g., via the plate line 215) may be referred to as "moving the cell plate." Biasing the plate line 215 and/or digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of capacitor 220— e.g., whether the initial logic state stored a logic 1 or a logic 0. In some schemes, the change in the stored charge of the capacitor may cause a change in the voltage of the digit line 210, which may be used by the sense component 130-a to determine the stored logic state of the memory cell 105-a.

Digit line 210 may connect many memory cells 105, and the digit line 210 may have properties that result in a non-negligible intrinsic capacitance 260 (e.g., on the order of picofarads (pF)), which may couple the digit line 210 with a voltage source 265-a, which may represent a common ground or virtual ground voltage, or the voltage of an adjacent access line of the circuit 200 (not shown). Although illustrated as a separate component in FIG. 2, the intrinsic capacitance 260 may be associated with properties distributed throughout the digit line 210.

For example, the intrinsic capacitance may depend on physical characteristics of the digit line 210, including conductor dimensions (e.g., length, width, and/or thickness)

of the digit line 210. The intrinsic capacitance 260 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-a may depend on the net capacitance of (e.g., associated with) the digit line 210.

That is, as charge flows along the digit line 210, some finite charge may be stored in the digit line 210 (e.g., in the intrinsic capacitance 260 or any other capacitance coupled with the digit line 210), and the resulting voltage of the digit line 210 may depend on the net capacitance of the digit line 210. The resulting voltage of digit line 210 after selecting the memory cell 105-a may be compared to a reference (e.g., a voltage of reference line 280) by the sense component 130-a to determine the logic state that was stored in the memory cell 105-a. Other operations may be used to support selecting and/or sensing the memory cell 105-a, including operations for supporting self-referencing sensing schemes with coupling capacitance as described herein.

In some examples, the circuit 200 may include an amplifier 275, which may amplify signals of the digit line 210 prior to a sensing operation. The amplifier 275 may include, for example, a transistor, a cascode, or any other charge or voltage amplifier. In some examples, the amplifier 275 may refer to a charge transfer sensing amplifier (CTSA). In some examples with an amplifier 275, a line between the sense component 130-a and the amplifier 275 may be referred to a signal line (e.g., signal line 270). In some examples (e.g., examples with or without an amplifier 275), the digit line 210 may connect directly with the sense component 130-a.

Some circuits that support self-referencing read operations in accordance with the present disclosure may share a common access line (not shown) between a memory cell 105 and a sense component 130 to support generating a sense signal and a reference signal from the same memory cell 105. In one example, a common access line between an amplifier 275 and a sense component 130 may be referred to as an "AMPCAP line" or an "AMPCAP node," and the common access line may take the place of the signal line 270 and the reference line 280 illustrated in circuit 200. In such examples the common access line may be connected to the sense component 130 at two different nodes (e.g., a first node 131-a and a second node 132-a, as described herein). In some examples, a common access line may permit a self-referencing read operation to share, in both a signal operation and a reference operation, component variations that may exist between the sense component 130-a and a memory cell 105 being accessed. This approach may reduce the sensitivity of the sense component 130-a to operational variations of various components in a memory device, such as memory cells 105, amplifiers (e.g., amplifier 275), transistors, voltage sources 265, and others.

Although the digit line 210 and the signal line 270 are identified as separate lines, the digit line 210, the signal line 270, and any other lines connecting a memory cell 105 with a sense component 130 may be referred to as a single access line in accordance with the present disclosure. Constituent portions of such an access line may be identified separately for the purposes of illustrating intervening components and intervening signals in various example configurations.

Sense component 130-a may include various transistors or amplifiers to detect and amplify a difference in signals, which may be referred to as latching. For example, sense component 130-a may include a sense amplifier that receives and compares a sense signal voltage at the first node 131-a with a reference signal voltage at the second node 132-a. An output of the sense amplifier may be driven to a higher (e.g., a positive) or a lower (e.g., negative or ground) voltage based on the comparison at the sense amplifier.

For example, if the first node 131-a has a lower voltage than the second node 132-a, the output of the sense component 130-a may be driven to a relatively lower voltage of a first sense component voltage source 265-b (e.g., a voltage of $V_L$, which may be a ground voltage substantially equal to $V_0$, or a negative voltage, for example). The sense component 130-a may latch the output of the sense amplifier to determine the logic state stored in the memory cell 105-a (e.g., detecting a logic 0 when the first node 131-a has a lower voltage than the second node 132-a).

If the first node 131-a has a higher voltage than the second node 132-a, the output of the sense component 130-a may be driven to the voltage of a second sense component voltage source 265-c (e.g., a voltage of $V_H$). The sense component 130-a may latch the output of the sense amplifier to determine the logic state stored in the memory cell 105-a (e.g., detecting a logic 1 when the first node 131-a has a higher voltage than the second node 132-a). The latched output of the amplifier, corresponding to the detected logic state of memory cell 105-a, may then be output via one or more input/output (I/O) lines (e.g., I/O line 290), which may include an output through a column decoder 135 via input/output component 140 described with reference to FIG. 1.

To perform a write operation on the memory cell 105-a, a voltage may be applied across the capacitor 220. Various methods may be used. In one example, the selection component 250 may be activated through the word line 205 to electrically connect the capacitor 220 to the digit line 210. A voltage may be applied across capacitor 220 by controlling the voltage of cell plate 230 (e.g., through plate line 215) and cell bottom 240 (e.g., through digit line 210).

For example, to write a logic 0, cell plate 230 may be taken high (e.g., applying a positive voltage to plate line 215), and cell bottom 240 may be taken low (e.g., virtually grounding or applying a negative voltage to digit line 210). The opposite process may be performed to write a logic 1, where cell plate 230 is taken low and cell bottom 240 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense component 130-a may be used to perform the write operations, which may include coupling the first sense component voltage source 265-b or the second sense component voltage source 265-c with the digit line.

The circuit 200, including the sense component 130-a, the selection component 250, or the amplifier 275, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In various examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In various examples where an p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In various examples the transistor(s) may be formed on a substrate that is dedicated to a particular component of the circuit 200 (e.g., a substrate for the sense component 130-a, a substrate for the amplifier 275, or a substrate for the memory cell 105-a), or the transistor(s) may be formed on a substrate that is common for particular components of the circuit 200 (e.g., a substrate that is common for the sense component 130-a, the amplifier 275, and the memory cell 105-a). Some FETs may have a metal portion including aluminum or other metal, but some FETS may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

The sense component 130-a may include a capacitive coupling between the first node 131-a and the second node 132-a, such as a capacitor element of the sense component 130-a or an intrinsic capacitance configured between sub-components of the sense component 130-a. The capacitive coupling may enable signals generated at the first node 131-a to affect the second node 132-a, and signals generated at the second node 132-a to affect the first node 131-a.

For example, a sense signal may be generated or otherwise developed from the memory cell 105-a at the first node 131-a in a first access operation, and a reference signal may be generated or otherwise developed from the memory cell 105-a at the second node 132-a in a second access operation. The reference signal may be generated at the second node 132-a in such a manner that the generating affects the signal at the first node 131-a. Such an effect (e.g., as provided by the coupling capacitance between the first node 131-a and the second node 132-b) may enable the sense component 130-a to detect a difference in signals between the first node 131-a and the second node 132-a, even when the access operations themselves may be associated with substantially the same signal (e.g., access operations associated with the same current, access operations associated with the same voltage, or access operations associated with the same amount of charge).

Figure 3:
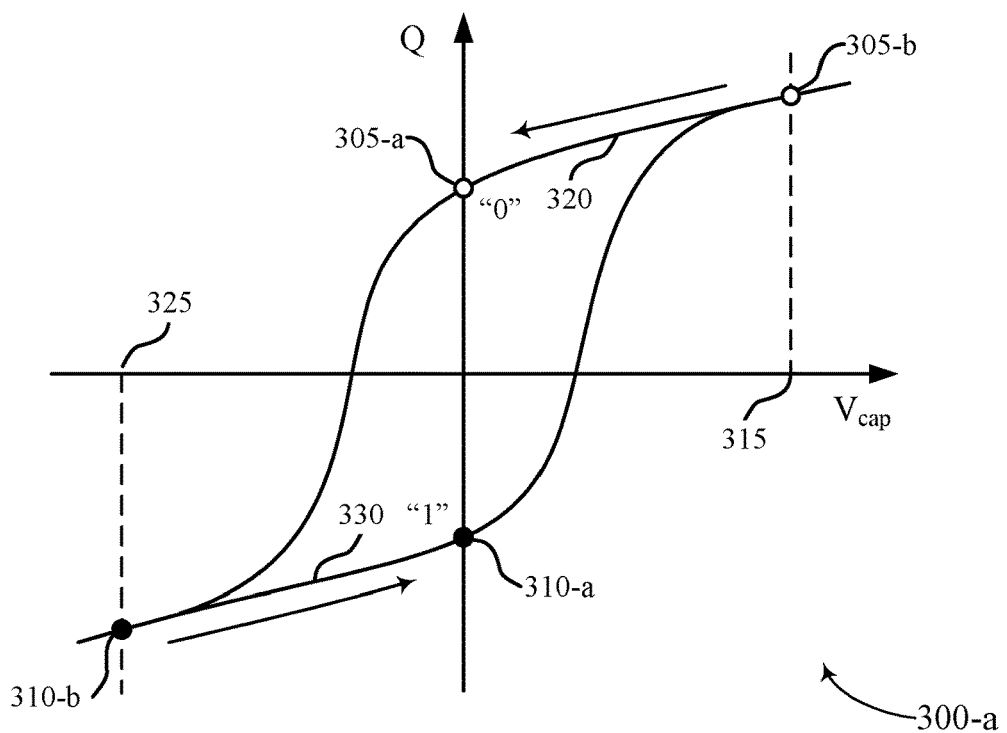
FIG. 3 illustrates an example of non-linear electrical properties with hysteresis plots for a memory cell that supports self-referencing sensing schemes with coupling capacitance in accordance with examples of the present disclosure.
Figure 3:
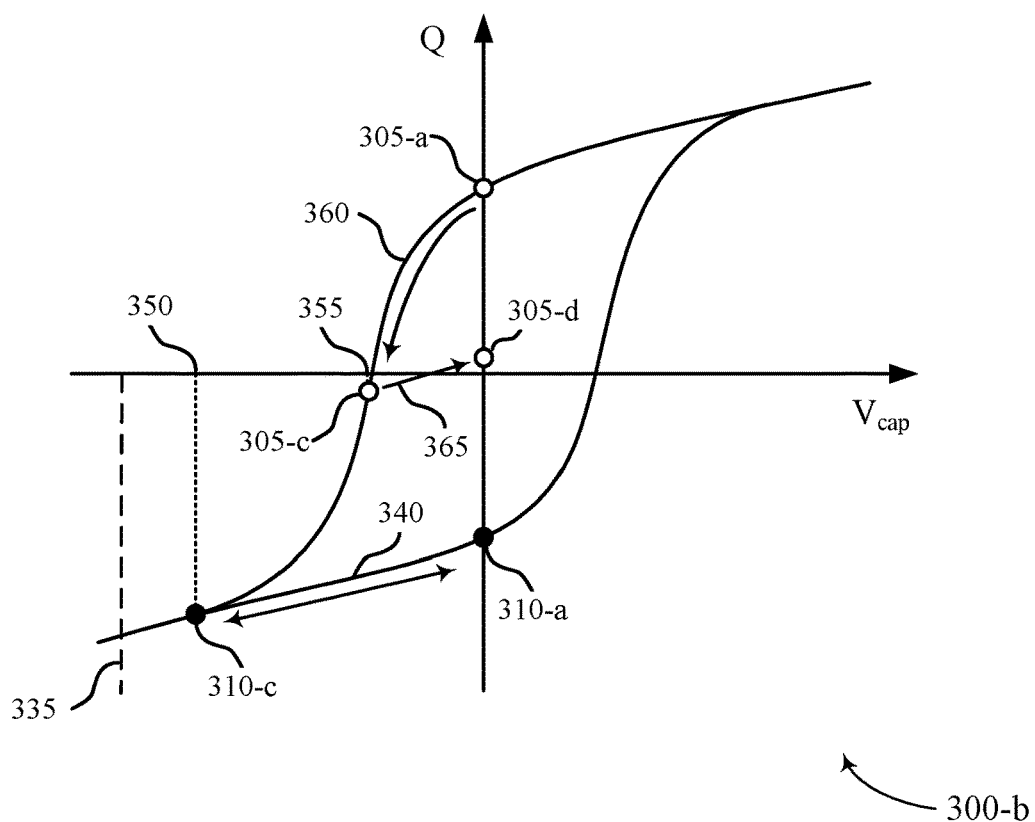

FIG. 3 illustrates an example of non-linear electrical properties with hysteresis plots 300-a and 300-b for a memory cell 105 that supports self-referencing sensing schemes with coupling capacitance in accordance with various embodiments of the present disclosure. Hysteresis plots 300-a and 300-b may illustrate an example writing process and reading process, respectively, for a memory cell 105 employing a ferroelectric capacitor 220 as described with reference to FIG. 2. Hysteresis plots 300-a and 300-b depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom} - V_{plate}$).

A ferroelectric material is characterized by a spontaneous electric polarization, where the material may maintain a non-zero electric charge in the absence of an electric field. Examples of ferroelectric materials include barium titanate ($BaTiO3$), lead titanate ($PbTiO3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in conventional DRAM arrays. Employing ferroelectric materials may reduce the need to perform refresh operations as described above for some DRAM architectures, such that maintaining logic states of an FeRAM architecture may be associated with substantially lower power consumption than maintaining logic states of a DRAM architecture.

Hysteresis plots 300-a and 300-b may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220.

Additionally, it should be understood that the voltages in hysteresis plots 300-a and 300-b represent a voltage difference across the capacitor (e.g., between the terminals of the ferroelectric capacitor 220) and are directional. For example, a positive voltage may be realized by applying a positive voltage to the perspective terminal (e.g., a cell bottom 240) and maintaining the reference terminal (e.g., a cell plate 230) at ground or virtual ground (or approximately zero volts (0V)). In some examples, a negative voltage may be applied by maintaining the perspective terminal at ground and applying a positive voltage to the reference terminal (e.g., cell plate 230). In other words, positive voltages may be applied to arrive at a negative voltage difference $V_{cap}$ across the ferroelectric capacitor 220 and thereby negatively polarize the terminal in question. Similarly, two positive voltages, two negative voltages, or any combination of positive and negative voltages may be applied to the appropriate capacitor terminals to generate the voltage difference $V_{cap}$ shown in hysteresis plots 300-a and 300-b.

As depicted in hysteresis plot 300-a, a ferroelectric material used in a ferroelectric capacitor 220 may maintain a positive or negative polarization when there is no net voltage difference between the terminals of the ferroelectric capacitor 220. For example, the hysteresis plot 300-a illustrates two possible polarization states, charge state 305-a and charge state 310-b, which may represent a positively saturated polarization state and a negatively saturated polarization state, respectively. Charge states 305-a and 310-a may be at a physical condition illustrating remnant polarization (Pr) values, which may refer to the polarization (or charge) that remains upon removing the external bias (e.g., voltage). The coercive voltage is the voltage at which the charge (or polarization) is zero. According to the example of hysteresis plot 300-a, charge state 305-a may represent a logic 0 when no voltage difference is applied across the ferroelectric capacitor 220, and charge state 310-a may represent a logic 1 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, voltage 315 may be a voltage equal to or greater than a positive saturation voltage, and applying the voltage 315 across the ferroelectric capacitor 220 may result in charge accumulation until charge state 305-b is reached (e.g., writing a logic 0).

Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between charge state 305-b and the charge state 305-a at zero voltage across the capacitor. Similarly, voltage 325 may be a voltage equal to or lesser than a negative saturation voltage, and applying the voltage 325 across the ferroelectric capacitor 220 results in charge accumulation until charge state 310-b is reached (e.g., writing a logic 1). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between charge state 310-b and the charge state 310-a at zero voltage across the capacitor. In some examples, the voltage 315 and the voltage 325, representing saturation voltages, may have the same magnitude, but opposite polarity.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic capacitance on access lines, and other factors. In other words, the charge state resulting from a read operation may depend on whether charge state 305-a or 310-a was initially stored, among other factors.

Hysteresis plot 300-b illustrates an example of reading of stored charge states 305-a and 310-a. A read voltage 335 may be applied, for example, as a voltage difference via a digit line 210 and a plate line 215 as described with reference to FIG. 2. Hysteresis plot 300-b may illustrate read operations where the read voltage 335 is negative voltage difference $V_{cap}$ (e.g., where $V_{bottom}-V_{plate}$ is negative). A negative read voltage across the capacitor may be referred to as a "plate high" read operation, where a plate line 215 is taken initially to a high voltage, and a digit line 210 is initially at a low voltage (e.g., a ground voltage). Although read voltage 335 is shown as a negative voltage across the ferroelectric capacitor 220, in alternative operations a read voltage may be a positive voltage across the ferroelectric capacitor 220, which may be referred to as a "plate low" read operation.

The read voltage 335 may be applied across the ferroelectric capacitor 220 when a memory cell 105 is selected (e.g., by activating a selection component 250 as described with reference to FIG. 2). Upon applying the read voltage 335 to the ferroelectric capacitor 220, charge may flow into or out of the ferroelectric capacitor 220 via the digit line 210 and plate line 215, and different charge states may result depending on whether the ferroelectric capacitor 220 was at charge state 305-a (e.g., a logic 1) or at charge state 310-a (e.g., a logic 0).

When performing a read operation on a ferroelectric capacitor 220 at the charge state 310-a (e.g., a logic 1), additional negative charge may accumulate across the ferroelectric capacitor 220, and the charge state may follow path 340 until reaching the charge and voltage of charge state 310-c. The amount of charge flowing through the capacitor 220 may be related to the intrinsic capacitance of the digit line 210 (e.g., intrinsic capacitance 260 described with reference to FIG. 2).

Accordingly, as shown by the transition between charge state 310-a and charge state 310-c, the resulting voltage 350 may be a relatively large negative value due to the relatively large change in voltage for the given change in charge. Thus, upon reading a logic 1 in a "plate high" read operation, the digit line voltage, equal to the sum of $V_{PL}$ and the value of ($V_{bottom}$–$V_{plate}$) at charge state 310-c, may be a relatively low voltage. Such a read operation may not change the remnant polarization of the ferroelectric capacitor 220 that stored charge state 310-a, and thus after performing the read operation the ferroelectric capacitor 220 may return to charge state 310-a via path 340 when the read voltage 335 is removed (e.g., by applying a zero net voltage across the ferroelectric capacitor 220). Thus, performing a read operation with a negative read voltage on a ferroelectric capacitor 220 with a charge state 305-a may be considered a non-destructive read process.

When performing the read operation on the ferroelectric capacitor 220 at the charge state 305-a (e.g., a logic 0), the stored charge may reverse polarity as a net negative charge accumulates across the ferroelectric capacitor 220, and the charge state may follow path 360 until reaching the charge and voltage of charge state 305-c. The amount of charge flowing through the capacitor 220 may again be related to the intrinsic capacitance of the digit line 210 (e.g., intrinsic capacitance 260 described with reference to FIG. 2). Accordingly, as shown by the transition between charge state 305-a and charge state 305-c, the resulting voltage 355 may be a relatively small negative value due to the relatively small change in voltage for the given change in charge. Thus, upon reading a logic 0 in a "plate high" read operation, the digit line voltage, equal to the sum of $V_{PL}$ and the value of ($V_{bottom}$–$V_{plate}$) at charge state 310-c, may be a relatively high voltage.

In various examples, a read operation with a negative read voltage (e.g., read voltage 335) may result in a reduction or a reversal of remnant polarization of the capacitor 220 that stored charge state 305-a. In other words, according to the properties of the ferroelectric material, after performing the read operation the ferroelectric capacitor 220 may not return to charge state 305-a when the read voltage 335 is removed (e.g., by applying a zero net voltage across the capacitor 220). Rather, when applying a zero net voltage across the ferroelectric capacitor 220 after a read operation with read voltage 335, the charge state may follow path 365 from charge state 305-c to charge state 305-d, illustrating a net reduction in polarization magnitude (e.g., a less positively polarized charge state than initial charge state 305-a). Thus, performing a read operation with a negative read voltage on a ferroelectric capacitor 220 with a charge state 305-a may be a destructive read process. However, in some sensing schemes, a reduced remnant polarization may still be read as the same stored logic state as a saturated remnant polarization state (e.g., supporting detection of a logic 1 from both charge state 305-a and charge state 305-d), thereby providing a degree of non-volatility for a memory cell 105 with respect to read operations.

The transition from charge state 305-a to charge state 305-d may be illustrative of a sensing operation that is associated with a partial reduction and/or partial reversal in polarization of a ferroelectric capacitor 220 of a memory cell (e.g., a reduction in the magnitude of charge Q from charge state 305-a to charge state 305-d). In various examples, the amount of change in polarization of a ferroelectric capacitor 220 of a memory cell 105 as a result of a sensing operation may be selected according to a particular sensing scheme. In some examples, sensing operations having a greater change in polarization of a ferroelectric capacitor 220 of a memory cell 105 may be associated with relatively greater robustness in detecting a logic state of a memory cell 105. In some sensing schemes, sensing a logic 0 of a ferroelectric capacitor 220 at a charge state 305-a may result in a full reversal of polarization, with the ferroelectric capacitor 220 transitioning from charge state 305-a to 310-a after the sensing operation. Such sensing schemes may be referred to as a "2Pr" sensing scheme, because the sensing operations may be based on a transition of charge equal to two times the saturation polarization magnitude of a ferroelectric capacitor 220 of the memory cell 105 being sensed.

The position of charge states 305-c and charge state 310-c after initiating a read operation may depend on a number of factors, including the specific sensing scheme and circuitry. In some cases, the final charge may depend on the net capacitance of the digit line 210 coupled with the memory cell 105, which may include an intrinsic capacitance 260, integrator capacitors, and others. For example, if a ferroelectric capacitor 220 is electrically coupled with digit line 210 at 0V and voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 130 may not be equal to the read voltage 335, or the resulting voltages 350 or 355, and instead may depend on the voltage of the digit line 210 following a period of charge sharing. The position of charge states 305-c and 310-c on hysteresis plot 300-b upon initiating a read operation may depend on the net capacitance of the digit line 210 and may be determined through a load-line analysis—e.g., charge states 305-c and 310-c may be defined with respect to the net capacitance of the digit line 210. As a result, the voltage of the ferroelectric capacitor 220 after initiating a read operation (e.g., voltage 350 when reading the ferroelectric capacitor 220 that stored charge state 310-a, or voltage 355 when reading the ferroelectric capacitor 220 that stored charge state 305-a), may be different and may depend on the initial state of the ferroelectric capacitor 220.

The initial state of the ferroelectric capacitor 220 may be determined by comparing the voltage of a digit line 210 (or signal line 270, where applicable) resulting from the read operation with a reference voltage (e.g., via a reference line 280 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored charge state 310-a, or voltage 355 when reading the ferroelectric capacitor 220 having a stored charge state 305-a). In some examples, the digit line voltage may be the difference between voltage 335 and the final voltage across the capacitor 220 (e.g., (voltage 335-voltage 350) when reading the ferroelectric capacitor 220 having a stored charge state 310-a, or (voltage 335-voltage 355) when reading the ferroelectric capacitor 220 having a stored charge state 305-a).

In some sensing schemes, a reference voltage may be generated such that the reference voltage is between the possible voltages that may result from reading different logic states. For example, a reference voltage may be selected to be lower than the resulting digit line voltage when reading a logic 0, and higher than the resulting digit line voltage when reading a logic 1. In other examples a comparison may be made at a portion of a sense component 130 that is different from a portion where a digit line is coupled, and therefore a reference voltage may be selected to be lower than the resulting voltage at the comparison portion of the sense component 130 when reading a logic 0, and higher than the resulting voltage at the comparison portion of the sense component 130 when reading a logic 1. During comparison by the sense component 130, the voltage based on the sensing may be determined to be higher or lower than the reference voltage, and the stored logic state of the memory cell 105 (e.g., a logic 0 or 1) may thus be determined.

During a sensing operation, the resulting signals from reading various memory cells 105 may be a function of manufacturing or operational variations between the various memory cells 105. For example, capacitors of various memory cells 105 may have different levels of capacitance or saturation polarization, so that a logic 1 may be associated with different levels of charge from one memory cell to the next, and a logic 0 may be associated with different levels of charge from one memory cell to the next. Further, intrinsic capacitance (e.g., intrinsic capacitance 260 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 may be associated with different levels of digit line voltage from one memory cell to the next (e.g., resulting voltage 350 may vary from reading one memory cell 105 to the next), and reading a logic 0 may be associated with different levels of digit line voltage from one memory cell to the next (e.g., resulting voltage 355 may vary from reading one memory cell 105 to the next).

In some examples, a reference voltage may be provided between a statistical average of voltages associated with reading a logic 1 and a statistical average of voltages associated with reading a logic 0, but the reference voltage may be relatively closer to the resulting voltage of reading one of the logic states for any given memory cell 105. The minimum difference between a resulting voltage of reading a particular logic state (e.g., as a statistical value for reading a plurality of memory cells 105 of a memory device) and an associated level of a reference voltage may be referred to as a "minimum read voltage difference," and having a low minimum read voltage difference may be associated with difficulties in reliably sensing the logic states of memory cells in a given memory device.

To reliably detect the logic state of a plurality of memory cells 105 that are subject to manufacturing and operational variations, a sense component 130 may be designed to employ self-referencing techniques, where a memory cell 105 itself is involved in providing a reference signal when reading the memory cell 105. However, when using the same memory cell 105 for providing both a sense signal and a reference signal, the sense signal and the reference signal may be substantially identical when performing access operations that do not change a state stored by the memory cell 105. For example, when performing a self-referencing read operation on a memory cell 105 storing a logic 1 (e.g., storing a charge state 310-*a*), a first access operation that includes applying voltage 335 may follow path 340, and a second operation that also includes applying voltage 335 may also follow path 340, and the first and second access operations may result in substantially the same access signals (e.g., from the perspective of the memory cell 105).

In such cases, when employing a sense component 130 that relies on a difference between a sense signal and a reference signal to detect a logic state stored by the memory cell 105, some other portion of a memory device may be required to provide such a difference in the event that access operations might provide substantially equal sense and reference signals. In accordance with examples of the present disclosure, a coupling capacitance may be provided between a first node 131 of a sense component 130 and a second node 132 of the sense component 130, and the coupling capacitance may provide at least a portion of the difference in signals that may be employed to detect the logic state stored by a memory cell 105.

Figure 4:
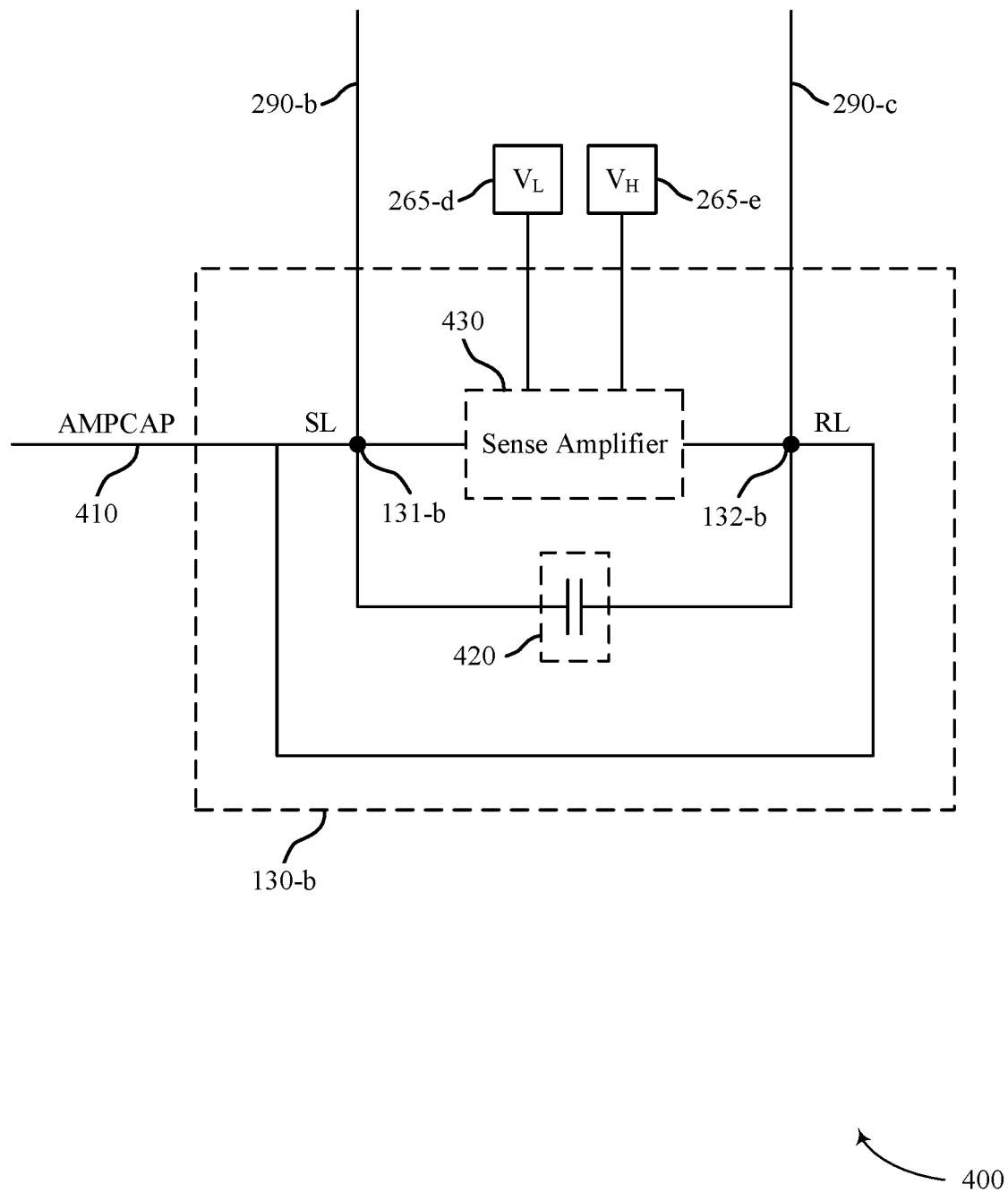
FIG. 4 illustrates an example of a circuit that supports self-referencing sensing schemes with coupling capacitance in accordance with examples of the present disclosure.

FIG. 4 illustrates an example of a circuit 400 that supports self-referencing sensing schemes with coupling capacitance in accordance with various embodiments of the present disclosure. The circuit 400 includes a sense component 130-*b* for sensing a logic state of one or more memory cells 105 (not shown) coupled with the sense component 130-*b* via a common access line 410. Electrical signals may be communicated between the sense component 130-*b* and the memory cells 105 via the common access line 410, which may be referred to as an AMPCAP line. Although only the single common access line 410 is shown, various other examples of a sense component 130 may include two or more access lines (e.g., two or more common access lines 410), which may be used to connect two or more memory cells 105 with the sense component 130-*b*.

The sense component 130-*b* may include a sense amplifier 430, which may be used to latch signals associated with a read operation when detecting a logic state stored by a memory cell 105. Electrical signals associated with such latching may be communicated between the sense component 130-*b* (e.g., the sense amplifier 430)) and an input/output component 140 (not shown) via I/O lines 290-*a* and 290-*c*. In some examples, the sense component 130-*b* may be in electronic communication with a memory controller (not shown), such as a memory controller 150 described with reference to FIG. 1, which may control various operations of the sense component 130-*b*.

The sense component 130-*b* includes a first node 131-*b* coupled between (e.g., located between) the sense amplifier 430 and the memory cells 105 (e.g., between the sense amplifier 430 and the common access line 410). The sense component 130-*b* includes a second node 132-*b*, separate from the first node 131-*b*, coupled between (e.g., located between) the sense amplifier 430 and the memory cells 105 (e.g., between the sense amplifier 430 and the common access line 410). The sense component 130-*b* also includes a coupling capacitance 420, coupled between the first node 131-*b* and the second node 132-*b* (e.g., capacitively coupling the first node 131-*b* and the second node 132-*b*). In other words, the first node 131-*b* and the second node 132-*b* may be capacitively coupled with one another through the coupling capacitance 420.

In some examples, the coupling capacitance 420 may be a capacitor element of the sense component. In other words, the coupling capacitance 420 may include particular features formed between nodes of the sense component 130-*b* to provide a particular capacitance between the nodes (e.g., dedicated features associated with forming a capacitor). In some examples the coupling capacitance 420 may be an intrinsic capacitance of the sense component 130-*b*. In other words, the coupling capacitance 420 may include features formed between nodes of the sense component 130-*b* that provide a particular capacitance between the nodes, and also provide other functions. For example, the coupling capacitance 420 may be associated with features of a first amplifier component of the sense amplifier 430 and a second amplifier component of the sense amplifier 430 (e.g., subcomponents of the sense amplifier 430), such as neighboring conductive traces or surfaces of the first and second sense amplifier components, which, due to their proximity and electrical isolation, provide a substantial capacitive coupling between the first node 131-*b* and the second node 132-*b*. In various examples of a sense component 130 in accordance with the present disclosure, a coupling capacitance 420 may include one or more capacitor elements, one or more features that provide an intrinsic capacitance, or various combinations thereof.

In various examples, the first node 131-*b* and the second node 132-*b* may be selectively coupled or isolated from other portions of the sense component 130-*b* by one or more switching components (not shown). For example, the sense component 130-*b* may include a switching component coupled between the first node and the second node that supports selectively adjusting the capacitive coupling of the second node with the first node. Additionally or alternatively, the sense component 130-*b* may include a switching component coupled between the memory cell and the first node that supports selectively coupling the memory cell with the first node. Additionally or alternatively, the sense component 130-*b* may include a switching component coupled between the memory cell and the second node, the third switching component configured to selectively couple the memory cell with the second node. In some examples, the first node 131-*b*, or the second node 132-*b*, or both, may also be capacitively coupled with a ground voltage source, or some other voltage source.

The sense component may include, or otherwise be provided a high sense component source voltage and a low sense component source voltage. For example, the sense component may be coupled with a high sense component voltage source 265-*e*, having a relatively high voltage level $V_H$. In some examples, $V_H$ may be referred to as VARY, and may have a voltage of approximately 1.6V. The sense component may also be coupled with a low sense component voltage source 265-*d*, having a relatively low voltage level $V_L$. In some examples, $V_L$ may be a ground or virtual ground voltage (e.g., 0V). In some examples a sense component 130 may be coupled with or include other voltage sources 265 (not shown).

Although the sense component 130-*b* is illustrated with a dashed line as reflecting a particular boundary, such a boundary is shown for illustrative purposes only. In other words, a sense component 130 in accordance with the present disclosure may be considered to have boundaries different than the dashed boundary shown in the circuit 400. For example, a sense component 130 may be considered to have a first node 131 and a second node 132 substantially at the boundary of the sense component 130, such that a common access line 410 is divided into separate branches outside the sense component 130. Further, in some examples a sense component 130 may be considered to include voltage sources, such as voltage sources 265-*d* and 265-*e*, such that the voltage sources would be within the illustrative boundary of the sense component 130.

By including the coupling capacitance 420, the sense component 130-*b* may provide improved functionality for supporting self-referencing read operations as compared with a sense component that does not include such a capacitive coupling. For example, a sense signal may be generated or otherwise developed from a memory cell 105 at the first node 131-*b* in a first access operation, and a reference signal may be generated or otherwise developed from the same memory cell 105 at the second node 132-*b* in a second access operation. Generating the reference signal at the second node 132-*b* may affect the behavior at the first node 131-*a* (e.g., causing a change in voltage at the first node 131-*b*, or an amount of charge associated with the first node 131-*a*). Such an effect (e.g., as provided by the coupling capacitance 420) may enable the sense component 130-*b* to detect a difference in signals between the first node 131-*b* and the second node 132-*b*, even when the access operations themselves may be associated with substantially the same signal (e.g., access operations associated with the same current, access operations associated with the same voltage, or access operations associated with the same amount of charge).

Figure 5:
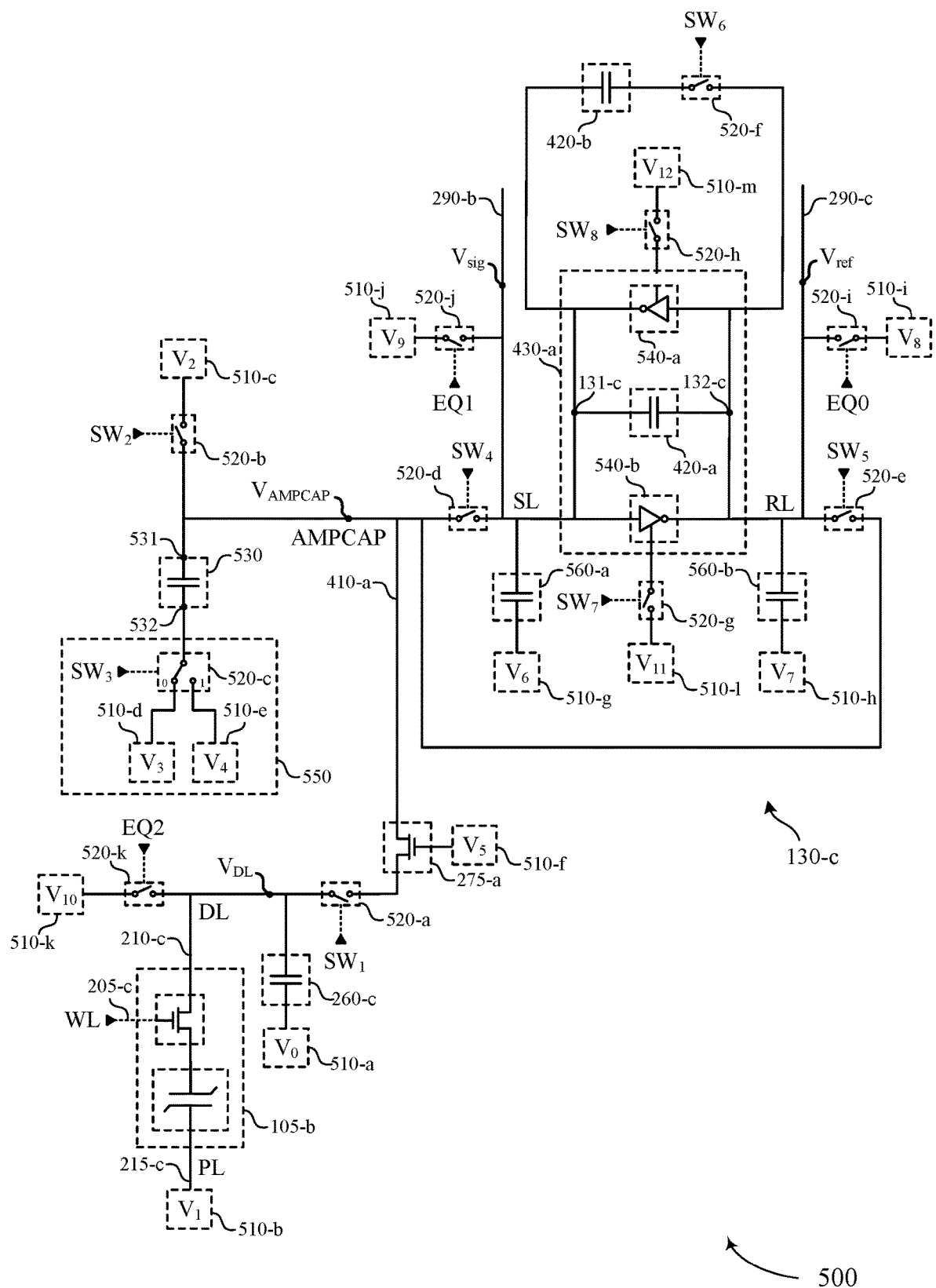
FIG. 5 illustrates an example of a circuit that supports self-referencing sensing schemes with coupling capacitance in accordance with examples of the present disclosure.

FIG. 5 illustrates an example of a circuit 500 that supports self-referencing sensing schemes with coupling capacitance in accordance with various embodiments of the present disclosure. The circuit 500 includes a sense component 130-*c* for sensing a logic state of a memory cell 105-*b*. Electrical signals may be communicated between the sense component 130-*c* and the memory cell 105-*b* via a digit line 210-*c* and a common access line 410-*a* (e.g., an AMPCAP line or an AMPCAP node), which may, in combination, be referred to as a single access line of the memory cell 105-*b*. Signals of the access line may be illustrated by voltage $V_{DL}$ on the digit line 210-*c*, and $V_{AMPCAP}$ on the common access line 410-*a*, as shown.

The circuit may also include an integrator capacitor 530, which may be coupled with a variable voltage source 550. Integrator capacitor 530 may be referred to as an AMPCAP. The integrator capacitor 530 may be coupled with the common access line 410-*a* at a first terminal 531, and coupled with the variable voltage source 550 at a second terminal 532. The example circuit 500 may also include an amplifier 275-*a* coupled between the digit line 210-*a* and the common access line 410-*a*, which may be enabled by voltage source 510-*f*.

The circuit 500 may include a word line 205-*c* for selecting or deselecting the memory cell 105-*b* (e.g., by way of logic signal WL). The circuit 500 may also include a plate line 215-*c* for accessing a cell plate of a capacitor of the memory cell 105-*b*. Thus, the memory cell 105-*b* may represent a memory cell coupled between a first access line (e.g., the digit line 210-*c* and the common access line 410-*a*) and a second access line (e.g., the word line 205-*c*). Electrical signals may be communicated between the sense component 130-*c* and an input/output component 140 (not shown) via input/output lines 290-*b* and 290-*c*, where signals of the input/output lines 290-*b* and 290-*c* may be illustrated by the voltages $V_{sig}$ and $V_{ref}$, respectively. In other words, the sense component 130-*c* may be coupled with the memory cell 105-*b* and coupled with an input/output component 140.

The sense component 130-*c* may have a first node 131-*c* and a second node 132-*c*, and the sense component 130-*c* may be configured to determine a logic state of the memory cell 105-*b* based at least in part on signals at the first node 131-*c* and the second node 132-*c*. In some examples, the first node 131-*c* and the second node 132-*c* may illustrate nodes of a sense amplifier 430-*a* of the sense component 130-*c*, which may be an example of a sense amplifier 430 as described with reference to FIG. 4. Although the first node 131-*c* and the second node 132-*c* are shown within the illustrative boundary of the sense amplifier 430-*a*, in various examples in accordance with the present disclosure the first node 131-*c* and the second node 132-*c* may be located within an illustrative boundary of the sense amplifier 430-*a*, located at the illustrative boundary of the sense amplifier 430-*a*, or located outside the illustrative boundary of the sense amplifier 430-*a*. In some examples, two or more of such locations (e.g., for either of the first node 131-c or the second node 132-c) may be electrically equivalent.

In some examples the first node 131-c may be referred to as a signal node, and may be electrically equivalent to, or otherwise associated with (e.g., coupled with) a signal line (SL) of the sense component 130-c. The first node 131-c may be coupled with the common access line 410-a via a switching component 520-d, which may be activated or deactivated by a logical signal SW$_4$. In other words, the switching component 520-d may illustrate a switching component 520 coupled between the memory cell 105-b and the first node 131-c, and configured to selectively couple the memory cell 105-b with the first node 131-c.

In some examples the second node 132-c may be referred to as a reference node, and may be electrically equivalent to, or otherwise associated with (e.g., coupled with) a reference line (RL) of the sense component 130-c. The second node 132-c may be coupled with the common access line 410-a via a switching component 520-e, which may be activated or deactivated by a logical signal SW$_5$. In other words, the switching component 520-e may illustrate a switching component 520 coupled between the memory cell 105-b and the second node 132-c, and configured to selectively couple the memory cell 105-b with the second node 132-c.

In some examples, a first node 131 and a second node 132 may be located at different portions of the sense component 130-c, which may or may not be electrically equivalent to the positions of the first node 131-c and the second node 132-c illustrated in the circuit 500. For example, the first node 131-c may be considered to be located outside the sense amplifier 430-a (e.g., electrically equivalent with such a location), and the first node 131-c may therefore be considered to be coupled between (e.g., located between) the sense amplifier 430-a and the memory cell 105-b. In another example, the second node 132-c may be considered to be located outside the sense amplifier 430-a (e.g., electrically equivalent with such a location), and the second node 132-c may therefore also be considered to be coupled between (e.g., located between) the sense amplifier 430-a and the memory cell 105-b. In some examples, the first node 131-c may be electrically equivalent to the input/output line 290-b, and the second node 132-c may be electrically equivalent to input/output line 290-c. In other examples, the first node 131-c and the second node 132-c may refer to other portions of a sense component 130, and may or may not be electrically equivalent to input/output lines 290.

In accordance with examples of the present disclosure, the first node 131-c and the second node 132-c may be capacitively coupled with one another. For example, the circuit 500 may include a coupling capacitance 420-a, which may illustrate an intrinsic capacitance of the sense amplifier 430-a. The coupling capacitance 420-a may include features formed between the first node 131-c and the second node 132-c that provide a particular capacitance between the nodes, and also provide other functions. For example, the sense amplifier 430-a may include one or more amplifier components, such as a first amplifier 540-a and a second amplifier 540-b. The coupling capacitance 420-a may be associated with features of the first amplifier 540-a and the second amplifier 540-b, such as neighboring conductive traces or surfaces of the first amplifier 540-a and the second amplifier 540-b, which, due to their proximity and electrical isolation, provide the capacitive properties of the coupling capacitance 420-a.

Additionally or alternatively, in some examples, the circuit 500 may include a coupling capacitance 420-b, which may illustrate an capacitor element of the sense component 130-c. In various examples, the coupling capacitance 420-b may or may not be associated with (e.g., included in the illustrative boundary of) the sense amplifier 430-a. The capacitive coupling 420-b may include particular features formed between the first node 131-c and the second node 132-c to provide a particular capacitance between the nodes. In some examples the coupling capacitance 420-b may be selectively adjusted (e.g., by a switching component). For example, circuit 500 may include a switching component 520-f, which may be activated or deactivated by a logical signal SW$_6$, which may enable or disable the capacitive coupling between the first node 131-c and the second node 132-c. In other words, the switching component 520-f may illustrate a switching component 520 coupled between the first node 131-c and the second node 132-c, and configured to selectively adjust the capacitive coupling of the second node 132-c and with the first node 131-c (e.g., selectively adjust the capacitive coupling between the first node 131-c and the second node 132-c).

In other examples, the order of the coupling capacitance 420-b and the switching component 520-f between the first node 131-c and the second node 132-c may be swapped. Various examples of a sense component 130 in accordance with the present disclosure may include one or more of a coupling capacitance 420-a (e.g., intrinsic capacitive coupling), one or more of a coupling capacitance 420-b (e.g., capacitor elements), or various combinations thereof.

The circuit 500 may include a variety of voltage sources 510, which may be coupled with various voltage supplies and/or common grounding or virtual grounding points of a memory device that includes the example circuit 500.

A voltage source 510-a may represent a common grounding point (e.g., a chassis ground, a neutral point, etc.), which may be associated with a common reference voltage having a voltage $V_0$, from which other voltages are defined. The voltage source 510-a may be coupled with the digit line 210-c via the intrinsic capacitance 260-c of the digit line 210-c.

A voltage source 510-b having a voltage $V_1$ may represent a plate line voltage source, and may be coupled with the memory cell 105-b via a plate line 215-c of the memory cell 105-b. In various examples, the voltage source 510-b may be used for access operations (e.g., read operations or write operations), including those operations described with reference to hysteresis plots 300-a and 300-b of FIG. 3.

A voltage source 510-c having a voltage $V_2$ may represent a precharge voltage source, and may be coupled with the common access line 410-a via a switching component 520-b, which may be activated or deactivated by a logical signal SW$_2$.

In the example of circuit 500, the variable voltage source 550 may include a voltage source 510-d having a voltage $V_3$, and a voltage source 510-e having a voltage $V_4$, which may be selected for connection with the integrator capacitor 530 by a switching component 520-c by way of a logical signal SW$_3$. In some examples the voltage source 510-d may be coupled with a common grounding point (not shown). In other examples the voltage source 510-d may be coupled with a voltage supply that provides a positive or negative voltage. Voltage source 510-e may be coupled with a voltage supply having a higher voltage than that of voltage source 510-d (e.g., a higher magnitude), thereby providing boosting functions described herein (e.g., in accordance with the difference in voltage between voltage source 510-e and 510-d, equal to $V_4-V_3$, or simply $V_4$ when the voltage source 510-d is grounded) for various access operations. Although a variable voltage source 550 is illustrated as including two voltage sources 510 and a switching component 520, a variable voltage source 550 supporting the operations herein may include other configurations, such as a voltage buffer that provides a variable voltage to the second terminal 532 of the integrator capacitor 530.

A voltage source 510-*f* having a voltage $V_5$ may represent an amplifier voltage source (e.g., a cascode voltage source), and may be coupled with the amplifier 275-*a* which may be an example of the amplifier 275 described with reference to FIG. 2. For example, the amplifier 275-*a* may be a transistor, and the voltage source 510-1 may be coupled with the gate of the transistor. The amplifier 275-*a* may be coupled with the common access line 410-*a* at a first terminal, and the digit line 210-*c* at a second terminal. In other words, the amplifier 275-*a* may be coupled between the digit line 210-*c* and the common access line 410-*a*.

The amplifier 275-*a* may provide a conversion of signals between the digit line 210-*c* and the common access line 410-*a*. For example, the amplifier 275-*a* may permit a flow of charge (e.g., electrical current) from the common access line 410-*a* to the digit line 210-*c*, as fed or enabled by the voltage source 510-*f*, upon a reduction in voltage of the digit line 210-*c* (e.g., upon selection of the memory cell 105-*b*). A relatively small flow of charge to the digit line 210-*c* may be associated with a relatively small change in voltage of the common access line 410-*a*, whereas a relatively large flow of charge to the digit line 210-*c* may be associated with a relatively large change in voltage of the common access line 410-*a*. According to the net capacitance of the common access line 410-*a*, for example, the common access line 410-*a* may undergo a relatively small change in voltage or a relatively large change in voltage depending on the flow of charge across the amplifier 275-*a* after selecting the memory cell 105-*b*. In some examples the amplifier 275-*a* may be isolated from the digit line 210-*c* by a switching component 520-*a*, which may be activated or deactivated by a logical signal $SW_1$. The amplifier 275-*a* may also referred to as a "voltage regulator" or a "bias component," relating to how the amplifier 275-*a* regulates a flow of charge in response to the voltage of the digit line 210-*c*.

A voltage source 510-*g* may represent a signal-side sense component reference point (e.g., a chassis ground, a neutral point, etc.), which may be associated with a reference voltage source having a voltage $V_6$. In various examples, the voltage source 510-*g* may or may not be associated with a same reference point as the common grounding point of voltage source 510-*a*. The voltage source 510-*g* may be coupled with the sense component 130-*c* (e.g., the first node 131-*c* or the signal line of the sense component 130-*c*, which may or may not be electrically equivalent) via a capacitance 560-*a*. Thus, in some examples, the first node 131-*c* may be capacitively coupled (e.g., via capacitance 560-*a*) with the voltage source 510-*g*, which may be a ground voltage source. In various examples, the capacitance 560-*a* may or may not be considered to be included as part of the sense component 130-*c*.

A voltage source 510-*h* may represent a reference-side sense component reference point (e.g., a chassis ground, a neutral point, etc.), which may be associated with a reference voltage source having a voltage $V_7$. In various examples, the voltage source 510-*h* may or may not be associated with a same reference point as the common grounding point of voltage source 510-*a*, and may or may not be associated with the same voltage level as the voltage source 510-*g*. For example, the voltage source 510-*h* may be selected to have the same voltage as the voltage source 510-*g* to improve symmetry of the sense component 130-*c*, or the voltage source 510-*h* may be selected to have a different voltage than the voltage source 510-*g* to bias signals between the first node 131-*c* and the second node 132-*c*.

The voltage source 510-*h* may be coupled with the sense component 130-*c* (e.g., the second node 132-*c* or the reference line of the sense component 130-*c*, which may or may not be electrically equivalent) via a capacitance 560-*b*. Thus, in some examples, the second node 132-*c* may be capacitively coupled (e.g., via capacitance 560-*b*) with the voltage source 510-*h*, which may be a ground voltage source. The capacitance 560-*b* may have the same or different amount of capacitance as the capacitance 560-*a*. For example, the capacitance 560-*b* may be selected to have the same amount of capacitance as the capacitance 560-*a* to improve symmetry of the sense component 130-*c*, or the capacitance 560-*b* may be selected to have a different amount of capacitance than the capacitance 560-*a* to bias signals between the first node 131-*c* and the second node 132-*c*. In various examples, the capacitance 560-*b* may or may not be considered to be included as part of the sense component 130-*c*.

The example of circuit 500 may also include various equalization voltage sources, which may each be associated with a common ground, chassis ground, or neutral point (e.g., a same voltage supply or reference point as the voltage source 510-*a*), or some other voltage supply.

A voltage source 510-*i* having a voltage $V_8$ may represent a reference-side equalization voltage source, and may be coupled with the sense component 130-*c* (e.g., the second node 132-*c* or the reference line of the sense component 130-*c*, which may or may not be electrically equivalent) via a switching component 520-*i*, which may be activated or deactivated by a logical signal $EQ_0$.

A voltage source 510-*j* having a voltage $V_9$ may represent a signal-side equalization voltage source, and may be coupled with the sense component 130-*c* (e.g., the first node 131-*c* or the signal line of the sense component 130-*c*, which may or may not be electrically equivalent) via a switching component 520-*j*, which may be activated or deactivated by a logical signal $EQ_1$.

A voltage source 510-*k* having a voltage $V_{10}$ may represent a digit line equalization voltage source, and may be coupled with the digit line 210-*c* via a switching component 520-*k*, which may be activated or deactivated by a logical signal $EQ_2$.

The example of circuit 500 may also include sense amplifier voltage sources, which may be examples of voltage sources 265-*b* and 265-*c* described with reference to FIG. 2.

A voltage source 510-1 having a voltage $V_{11}$ may represent a sense amplifier low voltage source, and may be coupled with the sense amplifier 430-*a* (e.g., amplifier 540-*b*) via a switching component 520-*g*, which may be activated or deactivated by a logical signal $SW_7$.

A voltage source 510-*m* having a voltage $V_{12}$ may represent a sense amplifier high voltage source, and may be coupled with the sense amplifier 430-*a* (e.g., amplifier 540-*a*) via a switching component 520-*h*, which may be activated or deactivated by a logical signal $SW_8$.

Each of the logical signals (e.g., $SW_1$ through $SW_8$ a, $EQ_0$ through $EQ_2$, and WL) illustrated in circuit 500 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In some examples the voltage sources 510-1 and 510-m may be selected according to particular input or output parameters. For example, voltage sources 510-1 and 510-m may be substantially at 0V and 1V, respectively, in accordance with certain I/O component conventions such as certain DRAM or FeRAM conventions.

In various examples, voltage sources 510 may be coupled with different configurations of voltage supplies and/or common grounding or virtual grounding points of a memory device that includes the example circuit 500. For example, in some embodiments voltage sources 510-a, 510-d, 510-g, 510-h, 510-i, 510-j, 510-k, and 510-1, or any combination thereof, may be coupled with the same ground point or virtual ground point, and may provide substantially the same reference voltage for various operations of accessing the memory cell 105-b.

In some embodiments, several voltage sources 510 may be coupled with the same voltage supply of a memory device. For example, in some embodiments, voltage sources 510-c and 510-e may be coupled with a voltage supply having a certain voltage (e.g., a voltage of 1.5V, which may be referred to as "VARY"). In such embodiments, the common access line 410-a may be boosted to a voltage substantially equal to 2*VARY, or approximately 3.0V, prior to selecting the memory cell 105-b via word line 205-a for sensing.

Although voltage sources 510 may be coupled with common voltage supplies and/or grounding points, the voltage of each of the voltage sources 510 coupled with a common voltage supply or common grounding point may be different due to various differences in the circuit 500 (e.g., conductor length, width, resistance, capacitance, etc.) between the respective voltage sources 510 and the associated common voltage supply or common grounding point.

Figure 6A:
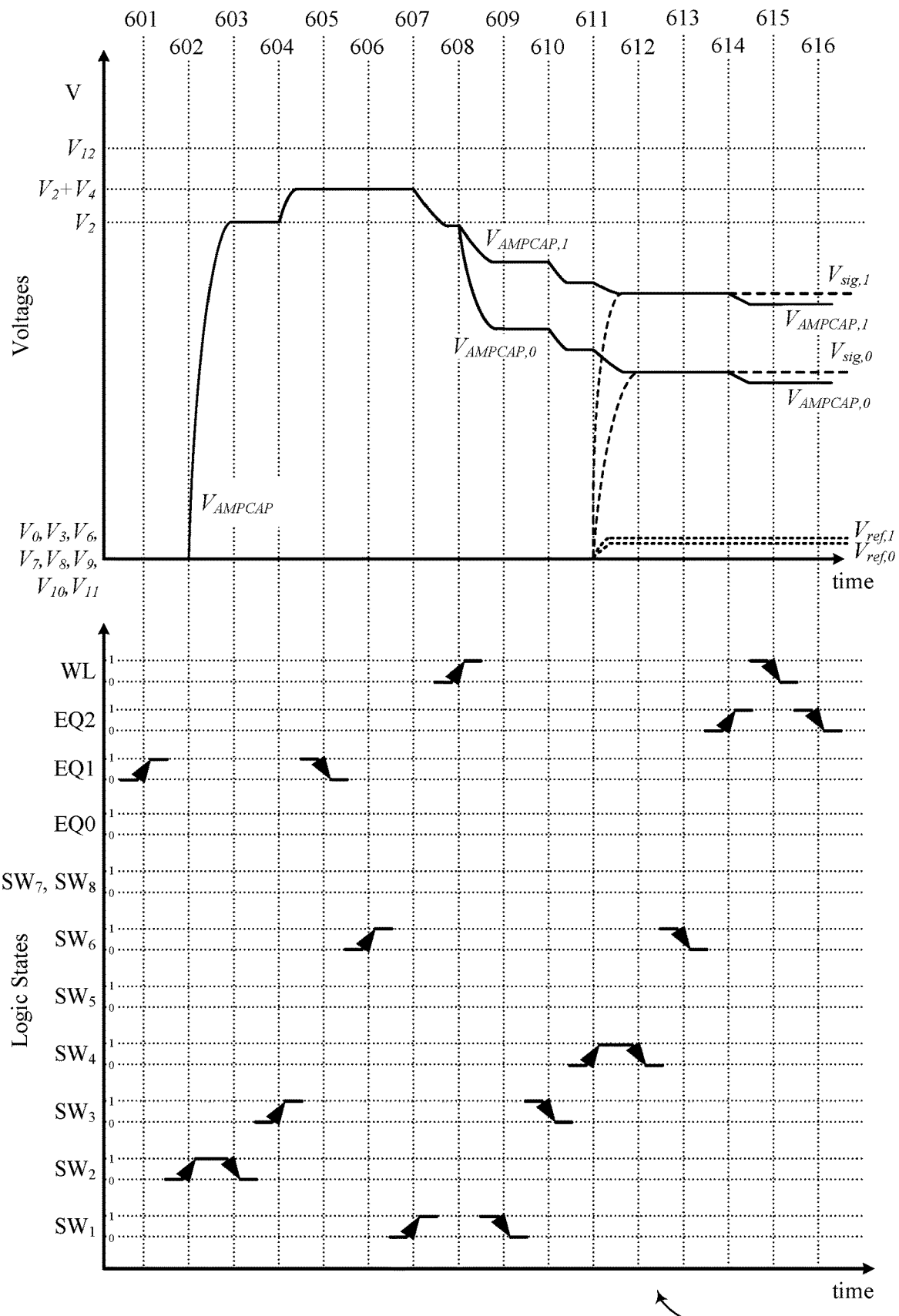
FIGS. 6A and 6B show a timing diagram illustrating operations of an example access procedure that supports self-referencing sensing schemes with coupling capacitance in accordance with various embodiments of the present disclosure.
Figure 6B:
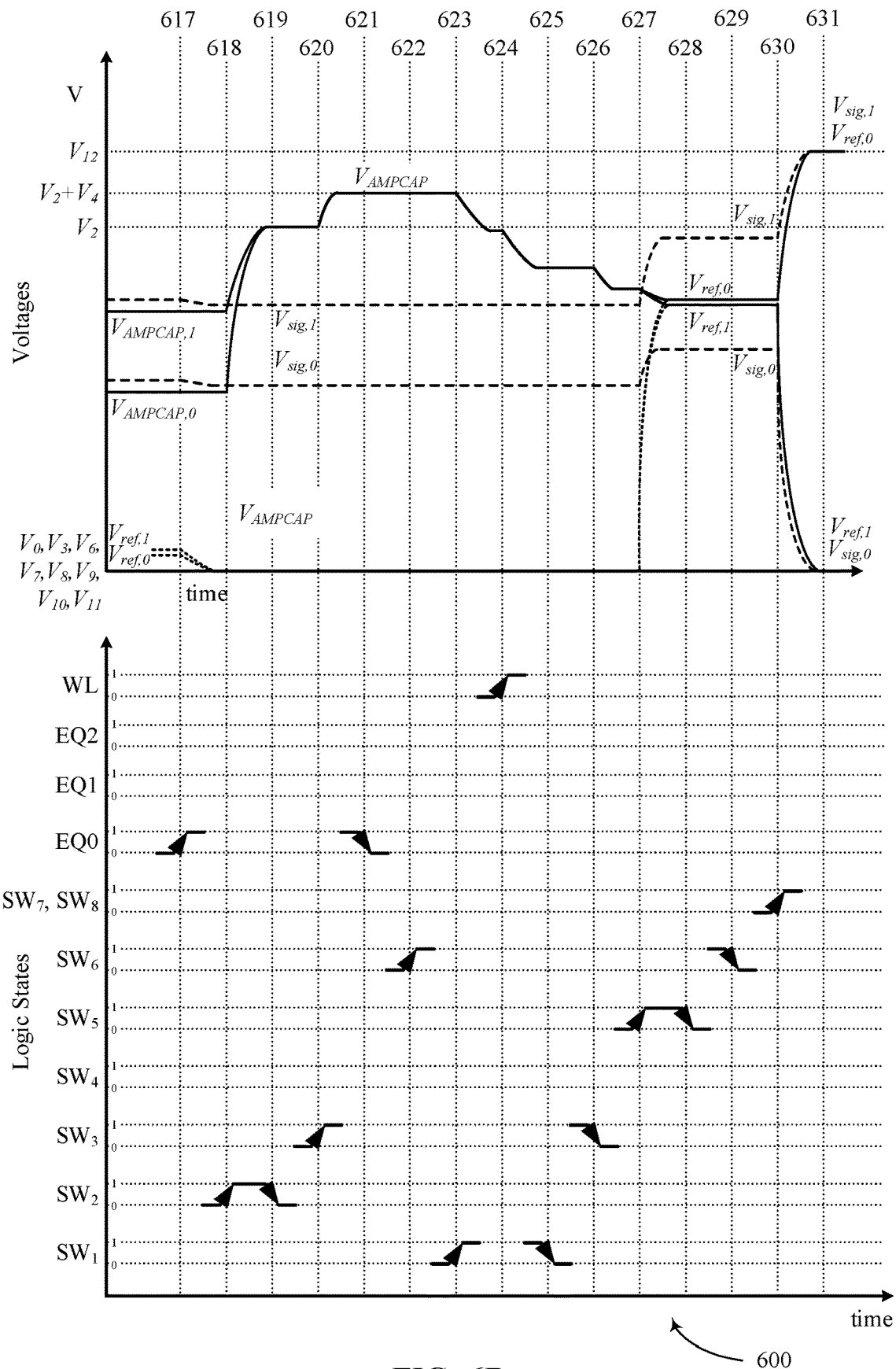

FIGS. 6A and 6B show a timing diagram 600 illustrating operations of an example read operation that supports self-referencing sensing schemes with coupling capacitance in accordance with various embodiments of the present disclosure. The timing diagram 600 is described with reference to components of the example circuit 500 of FIG. 5, and may illustrate an example of a self-referencing read operation.

In the example of timing diagram 600, memory cell 105-b initially stores a logic 1 state as described herein (e.g., with reference to FIG. 3). Further, voltage sources 510-a, 510-d, 510-g, 510-h, 510-i, 510-j, 510-k, and 510-1, are considered to be grounded (e.g., according to a ground or virtual ground), and therefore at a zero voltage (e.g., $V_0$=0V, $V_3$=0V, $V_6$=0V, $V_7$=0V, $V_8$=0V, $V_9$=0V, $V_{10}$=0V, and $V_{11}$=0V). However, in other examples of self-referencing read operations in accordance with the present disclosure, voltage sources 510-a, 510-d, 510-g, 510-h, 510-i, 510-j, 510-k, and 510-1 may be at non-zero voltages, and the voltages illustrated by the timing diagram 600 may thus be adjusted accordingly.

In some examples, prior to initiating the operations of timing diagram 600, the digit line 210-c and the plate line 215-c may be controlled to the same voltage, which may minimize charge leakage across the memory cell 105-b. For example, according to the timing diagram 600, the digit line 210-c may have an initial voltage of 0V, which may be the same as the initial voltage of the plate line 215-c. In some examples, the digit line 210-c may have been equalized prior to the operations of timing diagram 600 (e.g., by activating the switching component 520-k as a result of activating logical signal EQ2), which may couple the digit line 210-c with an equalization voltage source (e.g., voltage source 510-k). In other examples, the digit line 210-c and the plate line 215-c may have some other initial voltage different from the ground voltage. Further, the timing diagram 600 may begin with an initial state in which the word line is not selected (e.g., logical signal WL is deactivated), and the digit line 210-c is isolated from the equalization voltage source 510-k (e.g., logical signal EQ2 is deactivated).

At 601, the read operation may include equalizing the first node 131-c (e.g., equalizing the signal line of the sense component 130-c). For example, at 601, the read operation may include activating the switching component 520-j (e.g., by activating logical signal EQ1), which may couple the first node 131-c with an equalization voltage source (e.g., voltage source 510-j). Thus, at 601, the voltage at the first node 131-c (e.g., $V_{sig}$) may be brought to an equalization voltage (e.g., 0V), which may or may not be different than an initial condition for the first node 131-c.

At 602, the read operation may include activating switching component 520-b (e.g., by activating logical signal $SW_2$). Activating switching component 520-b may connect voltage source 510-c with the common access line 410-a, and accordingly the voltage of common access line 410-a (e.g., $V_{AMPCAP}$) may rise to voltage level $V_2$ as charge flows into the integrator capacitor 530. Activating switching component 520-b at 602 may initiate a first precharging operation for the integrator capacitor 530. For example, at 602 the switching component 520-c may be deactivated, such that the voltage source 510-d (e.g., a ground or virtual ground voltage at 0V) is coupled with the second terminal 532 of the integrator capacitor 530, and the voltage source 510-c is coupled with the first terminal 531 of the integrator capacitor 530. Thus, the integrator capacitor 530 may be charged according to the voltage difference between the voltage source 510-c and the voltage source 510-d.

At 603, the read operation may include deactivating the switching component 520-b (e.g., by deactivating logical signal $SW_2$). Deactivating switching component 520-b may isolate voltage source 510-c from the common access line 410-a, and the voltage of common access line 410-a may hold at voltage level $V_2$. Upon deactivating the switching component 520-b the common access line 410-a, and thus the first terminal 531 of the integrator capacitor 530, may be floating.

At 604, the read operation may include activating switching component 520-c (e.g., by activating logical signal $SW_3$). Activating switching component 520-c may cause a transition from the voltage source 510-d being coupled with the second terminal 532 of the integrator capacitor 530 to the voltage source 510-e being coupled with the second terminal 532 of the integrator capacitor 530. By connecting the second terminal 532 of the integrator capacitor 530 to a voltage source at a higher voltage, the charge stored by the integrator capacitor 530 may be boosted to a higher voltage, and accordingly the voltage of common access line 410-a (e.g., $V_{AMPCAP}$), coupled with the first terminal 531 of the integrator capacitor 530, may rise to voltage level ($V_2$+$V_4$). Thus, activating switching component 520-c may initiate a first boosting operation for the integrator capacitor 530.

At 605, the read operation may include isolating the first node 131-c from the equalization voltage source 510-j. For example, at 605, the read operation may include deactivating the switching component 520-j (e.g., by deactivating logical signal EQ1), which may decouple the first node 131-c from the equalization voltage source (e.g., voltage source 510-j). At 605, the voltage at the first node 131-c may remain at the equalization voltage (e.g., 0V). In some examples, the operations of 601 through 605 may be referred to as a first precharge operation.

At 606, the read operation may include enabling a coupling capacitance between the first node 131-*c* and the second node 132-*c*. For example, at 606, the read operation may include activating the switching component 520-*f* (e.g., by activating logical signal SW$_6$), which may couple the first node 131-*c* with the second node 132-*c* via the coupling capacitance 420-*b* (e.g., a capacitor element of the sense component 130-*c*). In examples of self-referencing read operations performed with a sense component 130 that does not include a coupling capacitance 420-*b* or switching component 520-*f*, the operations of 606 may be omitted.

At 607, the read operation may include coupling the common access line 410-*c* with the digit line 210-*c* associated with the memory cell 105-*b*. For example, at 607, the read operation may include activating the switching component 520-*a* (e.g., by activating logical signal SW$_1$). As a result, charge may be shared between the integrator capacitor 530 and the intrinsic capacitance 260-*c* of the digit line 210-*c*, through the amplifier 275-*a*.

In some examples, the voltage of the digit line (e.g., V$_{DL}$) at 607 may be below the voltage source 510-*f* (e.g., V$_5$), which may allow the threshold voltage of the amplifier 275-*a* to be exceeded. When the threshold voltage of the amplifier 275-*a* is exceeded, charge may flow from the common access line 410-*c* (e.g., from the integrator capacitor 530) to the digit line 210-*c* across the amplifier 275-*c*, as well as a relatively small amount of charge from the voltage source 510-*f*, depending on the characteristics of the amplifier 275-*a*. Accordingly, charge may flow to the digit line 210-*c* until the voltage of the digit line 210-*c* reaches a voltage level equal to V$_5$-V$_{th,amp}$. Accordingly, as charge flows out of the integrator capacitor 530, the voltage of the common access line 410-*c* may drop after activating the switching component at 520-*a*, illustrated by the drop in voltage V$_{AMPCAP}$.

At 608, the read operation may include selecting the memory cell 105-*b* (e.g., by activating a word line via logical signal WL). Selecting the memory cell 105-*b* may cause a capacitor of the memory cell 105-*b* to be coupled with the digit line 210-*c*. Accordingly, charge may be shared between the memory cell 105-*b*, the digit line 210-*c*, and the common access line 410-*a*, which may depend on the logic state (e.g., the charge and/or polarization) stored in the memory cell 105-*b*. The voltage applied to the memory cell 105-*b* may correspond to voltage 335 described with reference to FIG. 3, which may support a 2Pr sensing scheme as described herein (e.g., the operations of timing diagram 600 may illustrate a 2Pr self-referencing read operation).

For example, when the memory cell 105-*b* stores a logic 1, the capacitor of the memory cell 105-*b* may store a negative charge by way of a negative polarization (e.g., a charge state 310-*a* as described with reference to FIG. 3). Thus, when memory cell 105-*b* storing a logic 1 is selected, a relatively small amount of charge may flow from the digit line 210-*c* to the memory cell 105-*b* (e.g., as compared with the memory cell 105-*b* that stores a logic 0). As charge flows from the digit line 210-*c* to the memory cell 105-*b*, the voltage of the digit line 210-*c* may again drop, which may allow the threshold voltage of the amplifier 275-*a* to again be exceeded. When the threshold voltage of the amplifier 275-*a* is exceeded, charge may continue to flow from the common access line 410-*a* (e.g., from the integrator capacitor 530) to the digit line 210-*c* across the amplifier 275-*a*, as well as a relatively small amount of charge from the voltage source 510-*f*, depending on the characteristics of the amplifier 275-*c*. Accordingly, charge may flow to the digit line 210-*c* until the voltage of the digit line 210-*c* again returns to the voltage level equal to V$_5$-V$_{th,amp}$. When selecting the memory cell 105-*b* storing a logic 1, because a relatively small amount of charge flows into the memory cell 105-*b* at 608, the common access line 410-*a* may undergo a relatively small voltage drop after selecting the memory cell 105-*b* (e.g., as compared with the memory cell 105-*b* storing a logic 0), illustrated by the drop in voltage V$_{AMPCAP,1}$.

In another example, when the memory cell 105-*b* stores a logic 0, the capacitor of the memory cell 105-*b* may store a positive charge by way of a positive polarization (e.g., a charge state 305-*a* as described with reference to FIG. 3). Thus, when memory cell 105-*b* storing a logic 0 is selected, a relatively large amount of charge may flow from the digit line 210-*c* to the memory cell 105-*b* (e.g., as compared with the memory cell 105-*b* that stores a logic 1). As charge flows from the digit line 210-*c* to the memory cell 105-*b*, the voltage of the digit line 210-*c* may again drop, which may allow the threshold voltage of the amplifier 275-*a* to again be exceeded. When the threshold voltage of the amplifier 275-*a* is exceeded, charge may continue to flow from the common access line 410-*a* (e.g., from the integrator capacitor 530) to the digit line 210-*c* across the amplifier 275-*a*, as well as a relatively small amount of charge from the voltage source 510-*f*, depending on the characteristics of the amplifier 275-*c*. Accordingly, charge may flow to the digit line 210-*c* until the voltage of the digit line 210-*c* again returns to the voltage level equal to V$_5$-V$_{th,amp}$. When selecting the memory cell 105-*b* storing a logic 0, because a relatively large amount of charge flows into the memory cell 105-*b* at 608, the common access line 410-*a* may undergo a relatively large voltage drop after selecting the memory cell 105-*b* (e.g., as compared with the memory cell 105-*b* storing a logic 1), illustrated by the drop in voltage V$_{AMPCAP,0}$.

Whether the memory cell 105-*b* originally stored a logic 0 or a logic 1 state, the operations leading to and including those at 608 may write a logic 1 state to the memory cell 105-*b*. For example, as applied to an FeRAM memory cell 105, the operations leading to and including those at 608 may correspond to a voltage being applied to the memory cell 105-*b*, or an amount of charge flowing through the memory cell 105-*b*, that substantially polarizes the memory cell 105-*b* (e.g., saturates the memory cell 105-*b* with a negative polarization). Thus, following the operations of 608, the memory cell 105-*b* may be associated with a logic 1 state, but the memory cell 105-*b* may not return to a charge state 310-*a* immediately following the operations of 608 (e.g., the memory cell 105-*b* may be at some other point along path 340 described with reference to FIG. 3). In different examples of memory cells 105 (e.g., DRAM, PCM, and others), the memory cell 105 may otherwise be associated with a particular logic state (e.g., a logic 1), regardless of the logic state stored by the memory cell 105 prior to the operations of timing diagram 600.

At 609, the read operation may include isolating the memory cell from the amplifier 275-*a* and the common access line 410-*a*. For example, at 609, the read operation may include deactivating the switching component 520-*a* (e.g., by deactivating logical signal SW$_1$). The voltage of the common access line 410-*c* may be substantially maintained at 609 (e.g., at either V$_{AMPCAP,0}$ or V$_{AMPCAP,1}$, depending on the logic state that was originally stored by the memory cell 105 prior to the operations of the timing diagram 600)

At 610, the read operation may include deactivating switching component 520-*c* (e.g., by deactivating logical signal SW$_3$). Deactivating switching component 520-*c* may cause a transition from the voltage source 510-*e* being coupled with the second terminal 532 of the integrator capacitor 530 to the voltage source 510-d being coupled with the second terminal 532 of the integrator capacitor 530. By connecting the second terminal 532 of the integrator capacitor 530 to the voltage source at a lower voltage, the charge stored by the integrator capacitor 530 may be shifted to a lower voltage, and accordingly the voltage of the common access line 410-a (e.g., either $V_{AMPCAP,0}$ or $V_{AMPCAP,1}$), coupled with the first terminal 531 of the integrator capacitor 530, may drop by voltage level of $V_4$-$V_3$ (or just $V_4$ in the event that voltage source 510-d is coupled with a common ground point). Thus, deactivating switching component 520-c may initiate a first shifting operation for the integrator capacitor 530.

At 611, the read operation may include coupling the common access line 410-a with the first node 131-c of the sense component 130-c. For example, at 611, the read operation may include activating the switching component 520-d (e.g., by activating logical signal SW4), which may couple the first node 131-c with the common access line 410-a. As a result, charge may be shared between the integrator capacitor 530 and the capacitance 560-a, and in the example of circuit 500, the voltage at the first node 131-c (e.g., $V_{sig}$) may rise while the voltage of the common access line 410-a (e.g., $V_{AMPCAP}$) falls, until the two voltages are equal (e.g., for a particular logic state that was stored in the memory cell 105-b).

Further, during the signal development at the first node 131-c, a signal may also be developed at the second node 132-c due to the capacitive coupling between the first node 131-c and the second node 132-c (e.g., coupling capacitance 420-a, coupling capacitance 420-b, or a combination thereof). In other words, as charge flows across the common access line 410-a and into the sense component 130-c (e.g., at the sense line), charge may be developed at the coupling capacitance 420-a or the coupling capacitance 420-b, which may cause the voltage at the second node 132-c (e.g., the voltage at the reference line of the sense component 130-c, which may be referred to as $V_{ref}$) to rise. Like the voltage at the first node 131-c, the change in voltage at the second node 132-c may also depend on the logic state originally stored by the memory cell 105-b. For example, when sensing a logic 1, the voltage at the second node 132-c may be higher than the voltage at the second node 132-c when reading a logic 0 (e.g., Vref,1 may be greater than Vref,0 as a result of the operations at 611).

Thus, as illustrated in the timing diagram 600, the signal at the second node 132-c (e.g., $V_{ref}$) may be based at least in part on a signal at the first node 131-c (e.g., $V_{sig}$) resulting from an access operation associated with the memory cell 105-b (e.g., selecting the memory cell 105-b at 608, or coupling the common access line 410-a with the first node 131-c of the sense component 130-c, or other steps that generate a signal from a first access operation at the first node 131-c). Further, as illustrated in the timing diagram 600, the signal at the second node 132-c (e.g., $V_{ref}$) may be based at least in part on the signal at the first node 131-c (e.g., $V_{sig}$) and a capacitive coupling between the first node 131-c and the second node 132-c (e.g., coupling capacitance 420-a, coupling capacitance 420-b, or a combination thereof).

At 612, the read operation may include isolating the first node 131-c from the common access line 410-a. For example, at 612, the read operation may include deactivating the switching component 520-d (e.g., by deactivating logical signal SW4), which may isolate the first node 131-c from the common access line 410-a.

At 613, the read operation may include disabling a coupling capacitance between the first node 131-c and the second node 132-c. For example, at 613, the read operation may include deactivating the switching component 520-f (e.g., by deactivating logical signal SW6), which may decouple the first node 131-c with the second node 132-c via the coupling capacitance 420-b. In other words the operations of 613 may illustrate changing an amount or a degree of capacitive coupling between the first node 131-c and the second node 132-c. In examples of self-referencing read operations performed with a sense component 130 that does not include a coupling capacitance 420-b or switching component 520-f, the operations of 613 may be omitted. In some examples, the operations of 606 through 613 may be referred to as a first read operation or a first access operation.

At 614, the read operation may include equalizing the digit line 210-c. For example, at 614, the read operation may include activating the switching component 520-k (e.g., by activating logical signal EQ2), which may couple the digit line 210-c with an equalization voltage source (e.g., voltage source 510-k). Thus, at 614, the voltage at the digit line 210-c may be brought to an equalization voltage (e.g., 0V). In various examples, the common access line 410-a may also experience a drop in voltage as charge flow across the amplifier 275-a, which may also substantially equalize the common access line 410-a (e.g., causing $V_{AMPCAP}$ to drop to an equalization voltage such as 0V).

At 615, the read operation may include deselecting the memory cell 105-b (e.g., by deactivating a word line via logical signal WL). Deselecting the memory cell 105-b may cause a capacitor of the memory cell 105-b to be decoupled from the digit line 210-c.

At 616, the read operation may include isolating the digit line 210-c from the equalization voltage source 510-k. For example, at 616, the read operation may include deactivating the switching component 520-k (e.g., by deactivating logical signal EQ2), which may decouple the digit line 210-c from the equalization voltage source (e.g., voltage source 510-k). At 616, the voltage at the digit line 210-c may remain at the equalization voltage (e.g., 0V). In some examples, the operations of 614 through 616 may be referred to as a reset operation. The operations of timing diagram 600 continue with the illustration of FIG. 6B At 617, the read operation may include equalizing the second node 132-c (e.g., equalizing the reference line of the sense component 130-c). For example, at 617, the read operation may include activating the switching component 520-i (e.g., by activating logical signal EQ0), which may couple the second node 132-c with an equalization voltage source (e.g., voltage source 510-i). Thus, at 617, the voltage at the second node 132-c may be brought to an equalization voltage (e.g., Vref may drop to 0V, whether the memory cell 105-b originally stored a logic 0 or a logic 1). In some examples, the voltage at the first node 131-c may also fall, due to the capacitive coupling between the first node 131-c and the second node 132-c (e.g., the capacitive coupling 420-a or the capacitive coupling 420-b). In other words, the operations at 617 may illustrate an example of generating a signal at the first node 131-c (e.g., $V_{AMCAP,1}$ or $V_{AMPCAP,1}$) that is based at least in part on the second node 132-c (e.g., reducing $V_{AMCAP,1}$ or $V_{AMPCAP,1}$ as a result of equalizing the second node 132-c at 617).

At 618, the read operation may include activating switching component 520-b (e.g., by activating logical signal SW2). Activating switching component 520-b may connect voltage source 510-c with the common access line 410-a, and accordingly the voltage of common access line 410-a may rise to voltage level $V_2$ as charge flows into the integrator capacitor 530. Activating switching component 520-*b* at 618 may initiate a second precharging operation for the integrator capacitor 530. For example, at 618 the switching component 520-*c* may be deactivated, such that the voltage source 510-*d* (e.g., a ground or virtual ground voltage at 0V) is coupled with the second terminal 532 of the integrator capacitor 530, and the voltage source 510-*c* is coupled with the first terminal 531 of the integrator capacitor 530. Thus, the integrator capacitor 530 may be charged according to the voltage difference between the voltage source 510-*c* and the voltage source 510-*d*. In some examples, the operations of 618 may be similar to, or the same as the operations of 602.

At 619, the read operation may include deactivating the switching component 520-*b* (e.g., by deactivating logical signal $SW_2$). Deactivating switching component 520-*b* may isolate voltage source 510-*c* from the common access line 410-*a*, and the voltage of common access line 410-*a* may hold at voltage level $V_2$. Upon deactivating the switching component 520-*b* the common access line 410-*a*, and thus the first terminal 531 of the integrator capacitor 530, may be floating. In some examples, the operations of 619 may be similar to, or the same as the operations of 603.

At 620, the read operation may include activating switching component 520-*c* (e.g., by activating logical signal $SW_3$). Activating switching component 520-*c* may cause a transition from the voltage source 510-*d* being coupled with the second terminal 532 of the integrator capacitor 530 to the voltage source 510-*e* being coupled with the second terminal 532 of the integrator capacitor 530. By connecting the second terminal 532 of the integrator capacitor 530 to a voltage source at a higher voltage, the charge stored by the integrator capacitor 530 may be boosted to a higher voltage, and accordingly the voltage of common access line 410-*a*, coupled with the first terminal 531 of the integrator capacitor 530, may rise to voltage level ($V_2+V_4$). Thus, activating switching component 520-*c* may initiate a second boosting operation for the integrator capacitor 530. In some examples, the operations of 620 may be similar to, or the same as the operations of 604.

At 621, the read operation may include isolating the second node 132-*c* from the equalization voltage source 510-*i*. For example, at 621, the read operation may include deactivating the switching component 520-*i* (e.g., by deactivating logical signal EQ0), which may decouple the second node 132-*c* from the equalization voltage source (e.g., voltage source 510-*i*). At 621, the voltage at the second node 132-*c* may remain at the equalization voltage (e.g., 0V). In some examples, the operations of 617 through 621 may be referred to as a second precharge operation. In some examples, the operations of 621 may be similar to, or the same as the operations of 605.

At 622, the read operation may include enabling a coupling capacitance between the first node 131-*c* and the second node 132-*c*. For example, at 622, the read operation may include activating the switching component 520-*f* (e.g., by activating logical signal $SW_6$), which may couple the first node 131-*c* with the second node 132-*c* via the coupling capacitance 420-*b* (e.g., a capacitor element of the sense component 130-*c*). In examples of self-referencing read operations performed with a sense component 130 that does not include a coupling capacitance 420-*b* or switching component 520-*f*, the operations of 622 may be omitted. In some examples, the operations of 622 may be similar to, or the same as the operations of 606.

At 623, the read operation may include coupling the common access line 410-*c* with the digit line 210-*c* associated with the memory cell 105-*b*. For example, at 623, the read operation may include activating the switching component 520-*a* (e.g., by activating logical signal $SW_1$). As a result, charge may be shared between the integrator capacitor 530 and the intrinsic capacitance 260-*c* of the digit line 210-*c*, through the amplifier 275-*a*. In some examples, the operations of 623 may be similar to, or the same as the operations of 607.

In some examples, the voltage of the digit line (e.g., $V_{DL}$) at 623 may be below the voltage source 510-*f* (e.g., $V_5$), which may allow the threshold voltage of the amplifier 275-*a* to be exceeded. When the threshold voltage of the amplifier 275-*a* is exceeded, charge may flow from the common access line 410-*c* (e.g., from the integrator capacitor 530) to the digit line 210-*c* across the amplifier 275-*c*, as well as a relatively small amount of charge from the voltage source 510-*f*, depending on the characteristics of the amplifier 275-*a*. Accordingly, charge may flow to the digit line 210-*c* until the voltage of the digit line 210-*c* reaches a voltage level equal to $V_5-V_{th,amp}$. Accordingly, as charge flows out of the integrator capacitor 530, the voltage of the common access line 410-*c* may drop after activating the switching component at 520-*a*, illustrated by the drop in voltage $V_{AMPCAP}$.

At 624, the read operation may include selecting the memory cell 105-*b* (e.g., by activating a word line via logical signal WL). Selecting the memory cell 105-*b* may cause a capacitor of the memory cell 105-*b* to be coupled with the digit line 210-*c*. Accordingly, charge may be shared between the memory cell 105-*b*, the digit line 210-*c*, and the common access line 410-*a*, which may depend on the logic state (e.g., the charge and/or polarization) stored in the memory cell 105-*b*. In some examples, the operations of 624 may be similar to, or the same as the operations of 608.

For example, because the operations of a preceding access operation (e.g., any one or more of the operations of 601 through 617) may be associated with writing a particular logic state to the memory cell 105-*b* (e.g., writing a logic 1), the capacitor of the memory cell 105-*b* may store a negative charge by way of a negative polarization (e.g., a charge state 310-*a* as described with reference to FIG. 3). Thus, when the memory cell 105-*b* storing a logic 1 is selected, a relatively small amount of charge may flow from the digit line 210-*c* to the memory cell 105-*b* (e.g., as compared with the memory cell 105-*b* that stores a logic 0). As charge flows from the digit line 210-*c* to the memory cell 105-*b*, the voltage of the digit line 210-*c* may again drop, which may allow the threshold voltage of the amplifier 275-*a* to again be exceeded. When the threshold voltage of the amplifier 275-*a* is exceeded, charge may continue to flow from the common access line 410-*a* (e.g., from the integrator capacitor 530) to the digit line 210-*c* across the amplifier 275-*a*, as well as a relatively small amount of charge from the voltage source 510-*f*, depending on the characteristics of the amplifier 275-*c*. Accordingly, charge may flow to the digit line 210-*c* until the voltage of the digit line 210-*c* again returns to the voltage level equal to $V_5-V_{th,amp}$. When selecting the memory cell 105-*b* storing a logic 1, because a relatively small amount of charge flows into the memory cell 105-*b* at 624, the common access line 410-*a* may undergo a relatively small voltage drop after selecting the memory cell 105-*b* (e.g., as compared with the memory cell 105-*b* storing a logic 0), illustrated by the drop in voltage $V_{AMPCAP}$. In some examples, the operations of 624 may be similar to, or the same as the operations of 608. In some examples (e.g., when performing the timing diagram on a memory cell 105-*b* storing a logic 1), a signal following the operations of 625 (e.g., $V_{AMPCAP}$) may be similar to, or substantially identical to a signal following the operations of 609 (e.g., $V_{AMPCAP,1}$).

At 625, the read operation may include isolating the memory cell from the amplifier 275-*a* and the common access line 410-*a*. For example, at 625, the read operation may include deactivating the switching component 520-*a* (e.g., by deactivating logical signal $SW_1$). In some examples, the operations of 618 may be similar to, or the same as the operations of 609. In some examples (e.g., when performing the timing diagram on a memory cell 105-*b* storing a logic 1), a signal following the operations of 625 (e.g., $V_{AMPCAP}$) may be similar to, or substantially identical to a signal following the operations of 609 (e.g., $V_{AMPCAP,1}$).

At 626, the read operation may include deactivating switching component 520-*c* (e.g., by deactivating logical signal $SW_3$). Deactivating switching component 520-*c* may cause a transition from the voltage source 510-*e* being coupled with the second terminal 532 of the integrator capacitor 530 to the voltage source 510-*d* being coupled with the second terminal 532 of the integrator capacitor 530. By connecting the second terminal 532 of the integrator capacitor 530 to the voltage source at a lower voltage, the charge stored by the integrator capacitor 530 may be shifted to a lower voltage, and accordingly the voltage of the common access line 410-*a*, coupled with the first terminal 531 of the integrator capacitor 530, may drop by voltage level of $V_4$–$V_3$ (or just $V_4$ in the event that voltage source 510-*d* is coupled with a common ground point). Thus, deactivating switching component 520-*c* may initiate a first shifting operation for the integrator capacitor 530. In some examples (e.g., when performing the timing diagram on a memory cell 105-*b* storing a logic 1), a signal following the operations of 626 (e.g., $V_{AMPCAP}$) may be similar to, or substantially identical to a signal following the operations of 610 (e.g., $V_{AMPCAP,1}$).

Because the operations of a preceding access operation (e.g., any one or more of the operations of 601 through 617) may be associated with writing a particular logic state to the memory cell 105-*b* (e.g., writing a logic 1), the voltage of the common access line 410-*c* (e.g., $V_{AMPCAP}$) resulting from the operations at any one or more of 618 through 626 may be similar (e.g., substantially identical) whether the logic state originally stored by the memory cell 105-*b* (e.g., prior to the operations of timing diagram 600) was a logic 0 or a logic 1.

Further, in some examples, the voltage of the common access line 410-*c* following the operations of any one or more of 618 through 626 may be similar (e.g., substantially identical) to the voltage of the common access line 410-*c* following a similar step in the preceding access operation. For example, the signal of $V_{AMPCAP}$ developed in the second access operation as a result of operations of any one or more of 618 through 623 may be similar or substantially identical to the signal of $V_{AMPCAP}$ developed in the first access operation as a result of the operations of any one or more of 602 through 607, respectively. However, in various examples the signals developed as a result of the operations at one of 618 through 626 may be different from the signals developed as a result of the operations at one of 602 through 610. For example, because the logic state of the memory cell is known at 618, the operations of any one or more of 618 through 627 may be changed (e.g., by a memory controller 150, as compared with similar operations 602 through 611, respectively, where applicable) based at least in part on the known logic state.

In addition, the duration of operations associated with one of 618 through 626 may be the same as or different from the duration of operations associated with 602 through 610, respectively. For example, because the logic state at 618 is known (e.g., a logic 1), or if the voltage of the common access line is starting at a higher level (e.g., when $V_{AMPCAP,0}$ and $V_{AMPCAP,1}$ just prior to 618 are both greater than $V_{AMPCAP}$ just prior to 602), the operations of 618 may be assigned (e.g., by a memory controller 150) with a shorter duration than operations associated with 602. This may be enabled because operations at 618 may be associated with a lesser amount of charge flowing than the operations at 602.

The operations of any one or more of 624 through 626 may illustrate generating a signal (e.g., $V_{AMPCAP}$) in a second access operation (e.g., a second read operation) that is similar to, or substantially identical to a signal generated in a first access operation (e.g., the operations of 608 through 610, respectively, of a first read operation). For example, the voltage of the common access line 410-*a* following the operations of 624 (e.g., $V_{AMPCAP}$ following 624) may be similar to, or substantially identical to the voltage of the common access line 410-*a* following the operations of 608 when reading the memory cell 105-*b* storing a logic state 1 (e.g., $V_{AMPCAP,1}$ following 608). However, as illustrated by the timing diagram 600, employing a coupling capacitance (e.g., coupling capacitance 420-*a* or 420-*b*) between the first node 131-*c* and the second node 132-*c* of the sense component 130-*c* may support generating a difference in signals from the first access operation and the second operation that may be used by the sense component 130-*c* to detect the logic state originally stored by the memory cell 105-*b*.

At 627, the read operation may include coupling the common access line 410-*a* with the second node 132-*c* of the sense component 130-*c*. For example, at 627, the read operation may include activating the switching component 520-*e* (e.g., by activating logical signal $SW_5$), which may couple the second node 132-*c* with the common access line 410-*a*. As a result, charge may be shared between the integrator capacitor 530 and the capacitance 560-*b*, and in the example of circuit 500, the voltage at the second node 132-*c* (e.g., $V_{ref}$) may rise while the voltage of the common access line 410-*a* (e.g., $V_{AMPCAP}$) falls, until the two voltages are equal.

As illustrated in the example of timing diagram 600, the signal developed at the second node 132-*c* may depend on whether the memory cell 105-*b* originally stored (e.g., prior to the operations of timing diagram 600) a logic 0 or a logic 1. This effect may be based at least in part on the first access operations of the memory cell 105-*b* (e.g., any one or more of the operations 601 through 617) having developed a signal (e.g., $V_{sig}$) at the first node 131-*c*, which is capacitively coupled with the second node 132-*c* (e.g., via coupling capacitance 420-*a*, coupling capacitance 420-*b*, or a combination thereof).

For example, when the memory cell 105-*b* originally stored a logic 0, the signal at the first node 131-*c* (e.g., $V_{sig,0}$) may be relatively low, and therefore the signal generated at the second node 132-*c* (e.g., $V_{ref,0}$) may be relatively high after the operations of 627. By way of contrast, when the memory cell 105-*b* originally stored a logic 1, the signal at the first node 131-*c* (e.g., $V_{sig,1}$) may be relatively high, and therefore the signal generated at the second node 132-*c* (e.g., $V_{ref,1}$) may be relatively low after the operations of 627.

Thus, the operations of 627 illustrate an example of generating a second sense signal (e.g., $V_{ref,0}$ or $V_{ref,1}$) at the second node 132-*c* of the sense component 130-*c* (e.g., of the sense amplifier 430-*a*) while the second node 132-*c* is coupled with the memory cell 105-*b*, where the second sense signal is based at least in part on a first sense signal (e.g., $V_{sig,0}$ or $V_{sig,1}$) and a capacitive coupling (e.g., capacitive coupling 420-*a*, capacitive coupling 420-*b*, or a combination thereof) between the first node 131-*c* and the second node 132-*c*. Further, the operations of 627 may illustrate an example of generating a signal (e.g., $V_{ref,1}$) of a second access operation at the second node 132-*c* that is different from a signal (e.g., $V_{sig,1}$) of a first operation at the first node 131-*c*, despite certain signals of the access operations being similar or substantially identical (e.g., $V_{AMPCAP}$ prior to 627 being similar to, or substantially identical to $V_{AMPCAP,1}$ prior to 611).

Further, during the signal development at the second node 132-*c* resulting from the operations of 627, the signal at the first node 131-*c* may also be altered, as supported by the capacitive coupling between the first node 131-*c* and the second node 132-*c* (e.g., coupling capacitance 420-*a*, coupling capacitance 420-*b*, or a combination thereof). For example, at 627 the voltage $V_{sig}$ (e.g., $V_{sig,0}$ or $V_{sig,1}$) may be shifted upward as a result of the rising voltage $V_{ref}$ (e.g., $V_{ref,0}$ or $V_{ref,1}$) at the second node 132-*c*. In other words, the signal at the first node 131-*c* may be based at least in part on developing the signal at the second node 132-*c*, and the capacitive coupling (e.g., capacitive coupling 420-*a*, capacitive coupling 420-*b*, or a combination thereof) between the first node 131-*c* and the second node 132-*c*.

In some examples, the development of signals at 627 may also be associated with expanding a sensing window of the circuit 500. For example, the range of sense signals (e.g., the difference between $V_{sig,0}$ and $V_{sig,1}$) following 627 may be greater than the range of the same signals prior to 627, due to the manner in which signals are shifted based on the logic state originally stored by the memory cell 105-*b*, and the capacitive coupling between the first node 131-*c* and the second node 132-*c*. Further, the difference between a sense signal and a reference signal (e.g., the sensing margin) may also be increased by the development of signals at 627. For example, as a result of the signal development at 627, the sense signal for a logic 0 (e.g., $V_{sig,0}$) may be shifted relatively higher while the reference signal for a logic 0 (e.g., $V_{ref,0}$) may be developed relatively lower, thereby increasing the difference between the two (e.g., $V_{sig,0}-V_{ref,0}$). In another example, as a result of the signal development at 627, the sense signal for a logic 1 (e.g., $V_{sig,1}$) may be shifted relatively lower while the reference signal for a logic 1 (e.g., $V_{ref,1}$) may be developed relatively higher, thereby increasing the difference between the two (e.g., $V_{ref,1}-V_{sig,1}$). These effects supported by the generation of signals at the first node 113-*c* and 132-*c* may support relatively high sense windows and sense margins in the sense component 130-*c*, thereby improving the performance of a memory device including the circuit 500.

At 628, the read operation may include isolating the second node 132-*c* from the common access line 410-*a*. For example, at 628, the read operation may include deactivating the switching component 520-*e* (e.g., by deactivating logical signal $SW_5$), which may isolate the second node 132-*c* from the common access line 410-*a*

At 629, the read operation may include disabling a coupling capacitance between the first node 131-*c* and the second node 132-*c*. For example, at 629, the read operation may include deactivating the switching component 520-*f* (e.g., by deactivating logical signal $SW_6$), which may decouple the first node 131-*c* with the second node 132-*c* via the coupling capacitance 420-*b*. In examples of self-referencing read operations performed with a sense component 130 that does not include a coupling capacitance 420-*b* or switching component 520-*f*, the operations of 613 may be omitted. In some examples, the operations of 606 through 613 may be referred to as a first read operation. In some examples, the operations of 622 through 629 may be referred to as a second read operation.

At 630, the read operation may include activating the sense amplifier 430-*a*, which may include enabling or otherwise coupling one or more voltage sources 510 with the sense amplifier 430-*a*. For example, at 630, the read operation may include activating switching component 520-*g* and switching component 520-*h* (e.g., by activating logical signals $SW_7$ and $SW_8$, respectively), which may be referred to as "firing" the sense amplifier 430-*a* or the sense component 130-*c*. The output voltage resulting from activating the sense amplifier 430-*a* may depend on the relative voltages of the first node 131-*c* and the second node 132-*c* prior to 630. In other words, the operations at 630 may be an example of detecting a difference between the stored voltages at the first node 131-*c* and the second node 132-*c*, which may be based at least in part on a first and second selection of the same memory cell 105-*d* (e.g., the activation of logic signal WL at 608 and 624).

For example, when detecting a logic 0 according to the timing diagram 600, where the signal at the first node 131-*c* (e.g., $V_{sig,0}$) is lower than the signal at the second node 132-*c* (e.g., $V_{ref,0}$), the voltage at the first node 131-*c* will fall to the lower of the sense amplifier voltages (e.g., $V_{11}$) and the voltage of the second node 132-*c* will rise to the higher of the sense amplifier voltages (e.g., $V_{12}$). In another example, when detecting a logic 1 according to the timing diagram 600, where the signal at the first node 131-*c* (e.g., $V_{sig,1}$) is greater than the signal at the second node 132-*c* (e.g., $V_{ref,1}$), the voltage at the first node 131-*c* will rise to the higher of the sense amplifier voltages (e.g., $V_{12}$) and the voltage of the second node 132-*c* will fall to the lower of the sense amplifier voltages (e.g., $V_{11}$). Accordingly, the operations of 630 may refer to, or otherwise be associated with detecting the logic state of the memory cell 105-*b*.

At 631, the read operation may include providing the latched detection signals (e.g., $V_{sig}$ and $V_{ref}$) to an I/O component (e.g., I/O component 140 described with reference to FIG. 1) via I/O lines 290-*b* and 290-*c*. Accordingly, the operations of 631 may be an example of providing a result of a logic state detection to an I/O component. In various examples, the operations of 631 may be preceded or followed by isolating the sense amplifier from the voltage supplies (e.g., by deactivating logical signals $SW_7$ and $SW_8$), or isolating the memory cell 105*b*-*b* from the common access line 410-*a* (e.g., by deactivating logical signal WL).

Although illustrated as separate operations occurring at different times, certain operations may occur simultaneously, or in a different order. In some examples, various operations may be advantageously initiated simultaneously to reduce the amount of time required to sense a logic state of the memory cell 105-*b*. For example, any two or more of enabling the variable voltage source 550 at 604, isolating the first node 131-*c* from the equalization voltage source at 605, adjusting the capacitive coupling at 606, coupling the common access line 410-*a* with the digit line 210-*c* at 607, and selecting the memory cell 105-*b* at 608, may occur in a different relative order, occur during overlapping durations, or occur simultaneously (e.g., when logical signals $SW_1$ and WL are driven simultaneously). Additionally or alternatively, two or more of enabling the variable voltage source 550 at 620, isolating the second node 132-*c* from the equalization voltage source at 621, adjusting the capacitive coupling at 622, coupling the common access line 410-a with the digit line 210-c at 623, and selecting the memory cell 105-b at 624, may occur in a different order, occur during overlapping durations, or occur simultaneously.

The order of operations shown in timing diagram 600 is for illustration only, and various other orders and combinations of steps may be performed to support self-referencing sensing schemes with coupling capacitance in accordance with the present disclosure. Further, the timing of the operations of the timing diagram 600 is also for illustration purposes only, and is not meant to indicate a particular relative duration between one operation and another. Various operations may occur over a duration that is relatively shorter or relatively longer than illustrated in various embodiments of self-referencing sensing schemes with coupling capacitance in accordance with the present disclosure.

The transitions of the logical signals of the timing diagram 600 are illustrative of transitions from one state to another, and generally reflect transitions between a disabled or deactivated state (e.g., state "0") and an enabled or activated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples a voltage associated with a logical signal may follow a ramping behavior, or time-constant (e.g., logarithmic or exponential) behavior over time from one logical state to another. In some examples the transition of a component from one state to another may be based at least in part on characteristics of the associated logical signal, including the voltage level of the logical signal or the transition characteristics of the logical signal itself. Thus, the transitions shown in timing diagram 600 are not necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

In order to support the operations described herein, including those described with reference to circuit 500 and timing diagram 600, the capacitive coupling between a first node 131 and a second node 132 of a sense component may be chosen for particular characteristics. For example, a capacitive coupling between the first node 131 and the second node 132 (e.g., a capacitor element, such as capacitive coupling 420-a described with reference to circuit 500, an intrinsic capacitance, such as capacitive coupling 420-b described with reference to circuit 500, or various combinations thereof) may be designed with a particular value of capacitance in relation to other capacitance of the sense component 130.

In one example, a capacitive coupling $C_{coup}$, which may refer to the combined effect of various intrinsic capacitance and capacitor elements between a first node 131 and a second node 132, may be selected with a value in relation to sense amplifier input capacitance $C_{SA}$, which may refer to the value of capacitance of one or both of the capacitance 560-a and 560-b illustrated in circuit 500. Specifically, $C_{coup}$ and $C_{SA}$ may be chosen in a manner that, nominally, supports the development of a reference signal (e.g., $V_{ref}$) that is centered between possible sense signals (e.g., $V_{sig,0}$ and $V_{sig,1}$) or otherwise balances the sense margin for different logic states (e.g., nominally supports the generation of $V_{sig,0} - V_{ref,0}$ equal to $V_{ref,1} - V_{sig,1}$). These considerations may be illustrated with reference to the voltages of the timing diagram 600 following the development of signals at 627 (e.g., the voltages just prior to 628).

For example, prior to 628, the voltages illustrated by timing diagram 600 may be given by the following:

$$V_{sig,1} = V_{sig,1(read)} + \Delta V_{sig,1} = V_{sig,1(read)} + c * V_{ref}$$

$$V_{sig,0} = V_{sig,0(read)} + \Delta V_{sig,0} \approx V_{sig,0(read)} + c * V_{ref}$$

$$V_{ref} = V_{ref,2(read)} - \Delta V_{ref} \approx V_{ref,2(read)}$$

where $V_{sig,1(read)}$ represents the voltage of the common access line 410-a when reading a memory cell storing a logic 1 (e.g., $V_{sig,1}$ just prior to 612), $V_{sig,0(read)}$ represents the voltage of the common access line 410-a when reading a memory cell storing a logic 0 (e.g., $V_{sig,0}$ just prior to 612), and c represents the capacitance ratio $C_{coup}/C_{SA}$. In the described example, $V_{ref,2(read)}$ may represent the voltage of the common access line 410-a when reading a memory cell storing a reference state (e.g., $V_{ref}$ just prior to 628), which in the described example may be a logic 1. In examples where a reference voltage $V_{ref}$ when reading a reference state of a memory cell 105 may depend on a logic state originally stored by the memory cell 105, $V_{ref,2(read)}$ may be based on (e.g., equal to the average of) possible values of $V_{ref}$, or equal to one of the possible values of $V_{ref}$. Thus, where the reference voltage $V_{ref}$ is between $V_{sig,0}$ and $V_{sig,1}$, the following equation may illustrate a range of voltage values that may provide a suitable difference for the sense component 130-c to detect a logic signal stored by the memory cell 105-b:

$$V_{sig,0} < V_{ref} * (1-c) < V_{sig,1}$$

Thus, in some examples, c may be chosen to center the reference voltage $V_{ref}$ between $V_{sig,0}$ and $V_{sig,1}$ by the following:

$$c = \frac{C_{coup}}{C_{SA}} = 1 - \frac{V_{sig,0(read)} + V_{sig,1(read)}}{2 * V_{ref,2(read)}}$$

Figure 7:
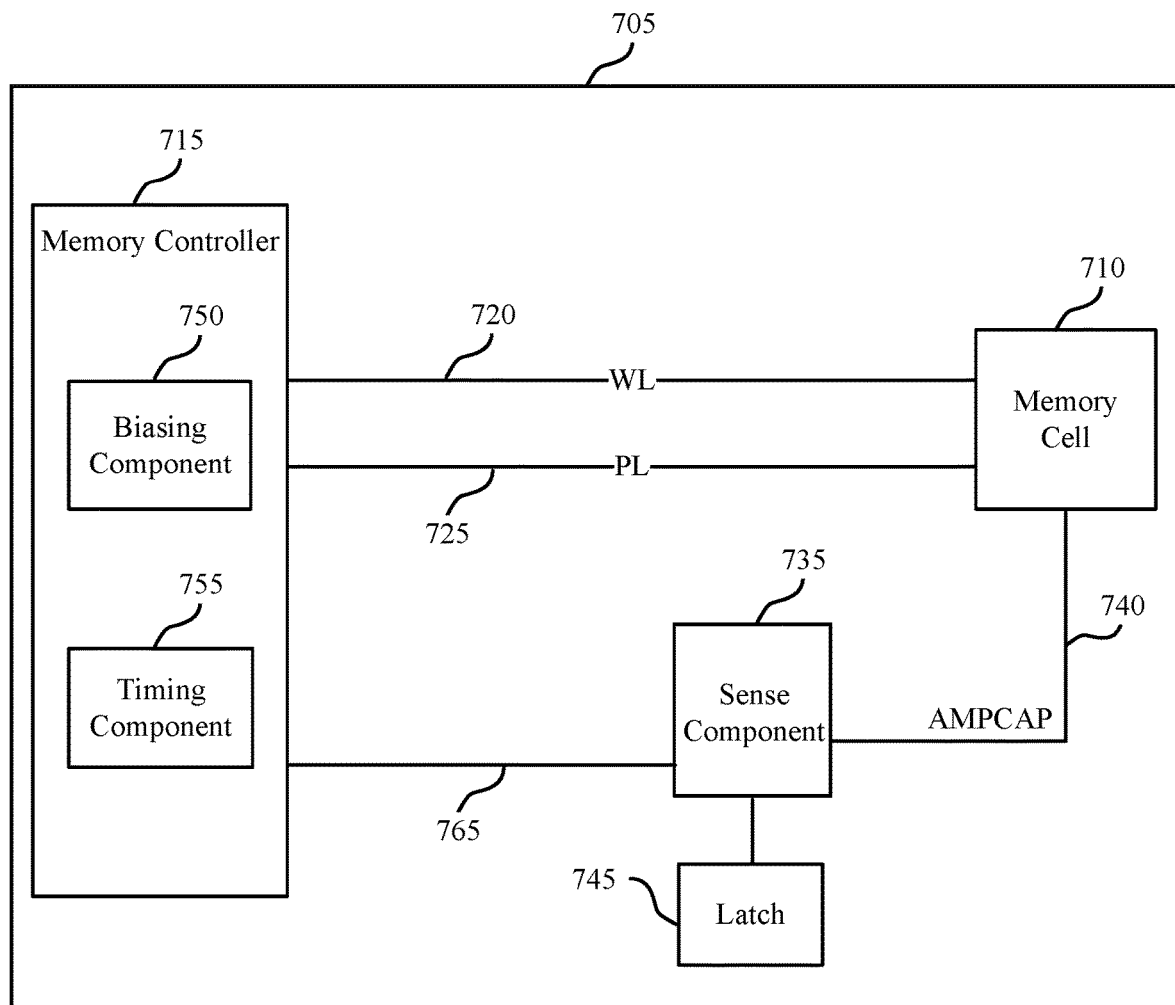
FIG. 7 shows a block diagram of a memory device that may support self-referencing sensing schemes with coupling capacitance in accordance with various embodiments of the present disclosure.

FIG. 7 shows a block diagram 700 of a memory device 705 that may support self-referencing sensing schemes with coupling capacitance in accordance with various embodiments of the present disclosure. Memory device 705 may be referred to as an electronic memory apparatus, and may be an example of a component of a memory device 100 as described with reference to FIG. 1.

Memory device 705 may include one or more memory cells 710, which may be an example of memory cells 105 described with reference to FIGS. 1 through 6. Memory device 705 may also include a memory controller 715, a word line 720, a plate line 725, a sense component 735, and a common access line 740 (e.g., an AMPCAP line). These components may be in electronic communication with each other and may perform one or more of the functions described herein in accordance with aspects of the disclosure. In some cases, memory controller 715 may include a biasing component 750 and timing component 755.

Memory controller 715 may be in electronic communication with word line 720, plate line 725, common access line 740, and sense component 735, which may be examples of a word line 205, a plate line 215, a common access line 410, and a sense component 130 described with reference to FIGS. 1 through 6. In some examples the memory device 705 may also include a latch 745, which may be an example of an I/O component 140 as described herein. The components of memory device 705 may be in electronic communication with each other and may perform embodiments of the functions described with reference to FIGS. 1 through 6. In some cases, the sense component 735 or latch 745 may be components of memory controller 715.

In some examples, common access line 740 is in electronic communication with sense component 735 and a ferroelectric capacitor of a memory cell 710. A memory cell 710 may be writable with a logic state (e.g., a first or second logic state). Word line 720 may be in electronic communication with memory controller 715 and a selection component of memory cell 710. Plate line 725 may be in electronic communication with memory controller 715 and a plate of the ferroelectric capacitor of memory cell 710. Sense component 735 may be in electronic communication with memory controller 715, common access line 740, and latch 745. In some examples, the common access line 740 may provide the functions of a signal line and a reference line. Sense control line 765 may be in electronic communication with sense component 735 and memory controller 715. These components may also be in electronic communication with other components, inside, or outside, or both of memory device 705, in addition to components not listed above, via other components, connections, or busses.

Memory controller 715 may be an example of a memory controller 150 as described herein, and may be configured to activate word line 720, plate line 725, or common access line 740 by applying voltages to various nodes. For example, biasing component 750 may be configured to apply a voltage to operate memory cell 710 to read or write memory cell 710 as described above. In some cases, memory controller 715 may include a row decoder, column decoder, or both, as described with reference to FIG. 1, which may enable memory controller 715 to access one or more memory cells 105. Biasing component 750 may also provide voltage potentials to the memory cell 710 to generate a reference signal for the sense component 735. Additionally or alternatively, biasing component 750 may provide voltage potentials for the operation of sense component 735.

In some cases, memory controller 715 may perform one or more of its operations using timing component 755. For example, timing component 755 may control the timing of the various word line selections or plate biasing, including timing for switching and voltage application to perform the memory functions, such as reading and writing, discussed herein (e.g., in accordance with operations described with reference to timing diagram 600 of FIGS. 6A and 6B). In some cases, timing component 755 may control the operations of biasing component 750.

Sense component 735 may compare a sense signal from the memory cell 710 (e.g., via common access line 740) with a reference signal from the memory cell 710 (e.g., via common access line 740). Upon determining the logic state, the sense component 735 may then store the output in latch 745, where it may be used in accordance with the operations of an electronic device that includes the memory device 705. Sense component 735 may include one or more amplifiers in electronic communication with the latch and the ferroelectric memory cell.

Memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 715 and/or at least some of its various sub-components may be physically located at various positions, including being distributed such that portions of functions are implemented at different physical locations by one or more physical devices. In some examples, memory controller 715 and/or at least some of its various sub-components may be a separate and distinct component in accordance with various embodiments of the present disclosure. In other examples, memory controller 715 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure. Memory controller 715 may be an example of the memory controller 915 described with reference to FIG. 9.

In some examples, the memory controller 715, including any subcomponents thereof, may support generating a first sense signal at a first node of a sense amplifier while the first node of the sense amplifier is coupled with a memory cell; generating a second sense signal at a second node of the sense amplifier while the second node of the sense amplifier is coupled with the memory cell, wherein the second sense signal is based at least in part on the first sense signal and a capacitive coupling between the first node of the sense amplifier and the second node of the sense amplifier; and determining a logic state stored by the memory cell based at least in part on generating the first sense signal and generating the second sense signal.

Figure 8:
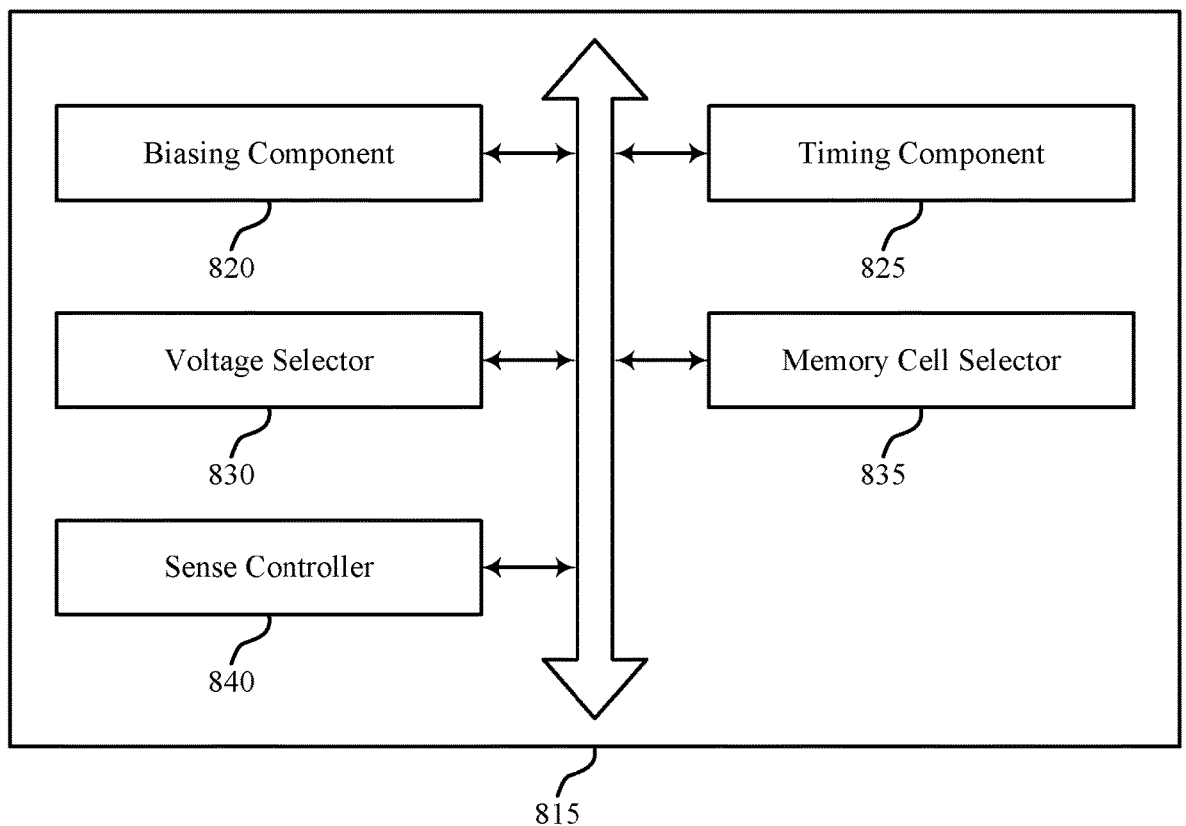
FIG. 8 shows a block diagram of a memory controller that may support self-referencing sensing schemes with coupling capacitance in accordance with various embodiments of the present disclosure.

FIG. 8 shows a block diagram 800 of a memory controller 815 that may support self-referencing sensing schemes with coupling capacitance in accordance with various embodiments of the present disclosure. The memory controller 815 may be an example of a memory controller 150 described with reference to FIG. 1 or a memory controller 715 described with reference to FIG. 7. The memory controller 815 may include a biasing component 820 and a timing component 825, which may be examples of biasing component 750 and timing component 755 described with reference to FIG. 7. The memory controller 815 may also include a voltage selector 830, a memory cell selector 835, and a sense controller 840. Each of these modules may communicate, directly or indirectly, with one another (e.g., via one or more buses).

Voltage selector 830 may initiate the selection of voltage sources to support various access operations of a memory device. For example, the voltage selector 830 may generate logical signals used to activate or deactivate various switching components, such as switching components 520 described with reference to FIG. 5. For example, the voltage selector 830 may generate one or more of the logical signals for selecting (e.g., enabling or disabling) voltage sources 510 of timing diagram 600 described with reference to FIGS. 6A and 6B.

Memory cell selector 835 may select a memory cell for sensing operations. For example, the memory cell selector

835 may generate logical signals used to activate or deactivate a selection component, such as selection component 250 described with reference to FIG. 2. For example, the memory cell selector 835 may generate the word line logical signals of timing diagram 600 described with reference to FIGS. 6A and 6B.

Sense controller 840 may control various operations of a sense component, such as sense components 130 described with reference to FIGS. 1 through 6. For example, the sense controller 840 may generate logical signals used to activate or deactivate a sense component isolation component, such as switching components 520-*d* or 520-*e* described with reference to FIGS. 5, 6A, and 6B. In some examples the sense controller 840 may generate logical signals used to equalize nodes of a sense component 130 or of a common access line 410, which may include activating or deactivating switching components such as switching components 520-*i*, 520-*j*, 520-*k* described with reference to FIGS. 5, 6A, and 6B. In some examples the sense controller 1040 may generate logical signals used to couple or decouple a sense component with a sensing voltage source, which may include activating or deactivating switching components such as switching components 520-*g* or 520-*h* described with reference to FIGS. 5, 6A, and 6B. In some examples the sense controller 1040 may generate logical signals used to couple or decouple a capacitance between a first node 131 and a second node 132, which may include activating or deactivating switching components such as switching component 520-*f* described with reference to FIGS. 5, 6A, and 6B. Thus, in various examples the sense controller 1040 may generate the logical signals $SW_4$, $SW_5$, $SW_6$, $SW_7$, or $SW_8$, EQ0, EQ1, or EQ2, or any combination thereof, of timing diagram 600 described with reference to FIGS. 6A and 6B.

In some embodiments the sense controller 840 may compare a voltage of a first node of the sensing component with a voltage of a second node of the sensing component, where the voltages are based on (e.g., result from) accessing the memory cell with separate access operations of a self-referencing read operation. The sense controller 840 may determine a logic value associated with the memory cell based on comparing the resultant voltages. In some examples the sense controller 840 may provide signals to another component to determine the logic value associated with the memory cell.

Figure 9:
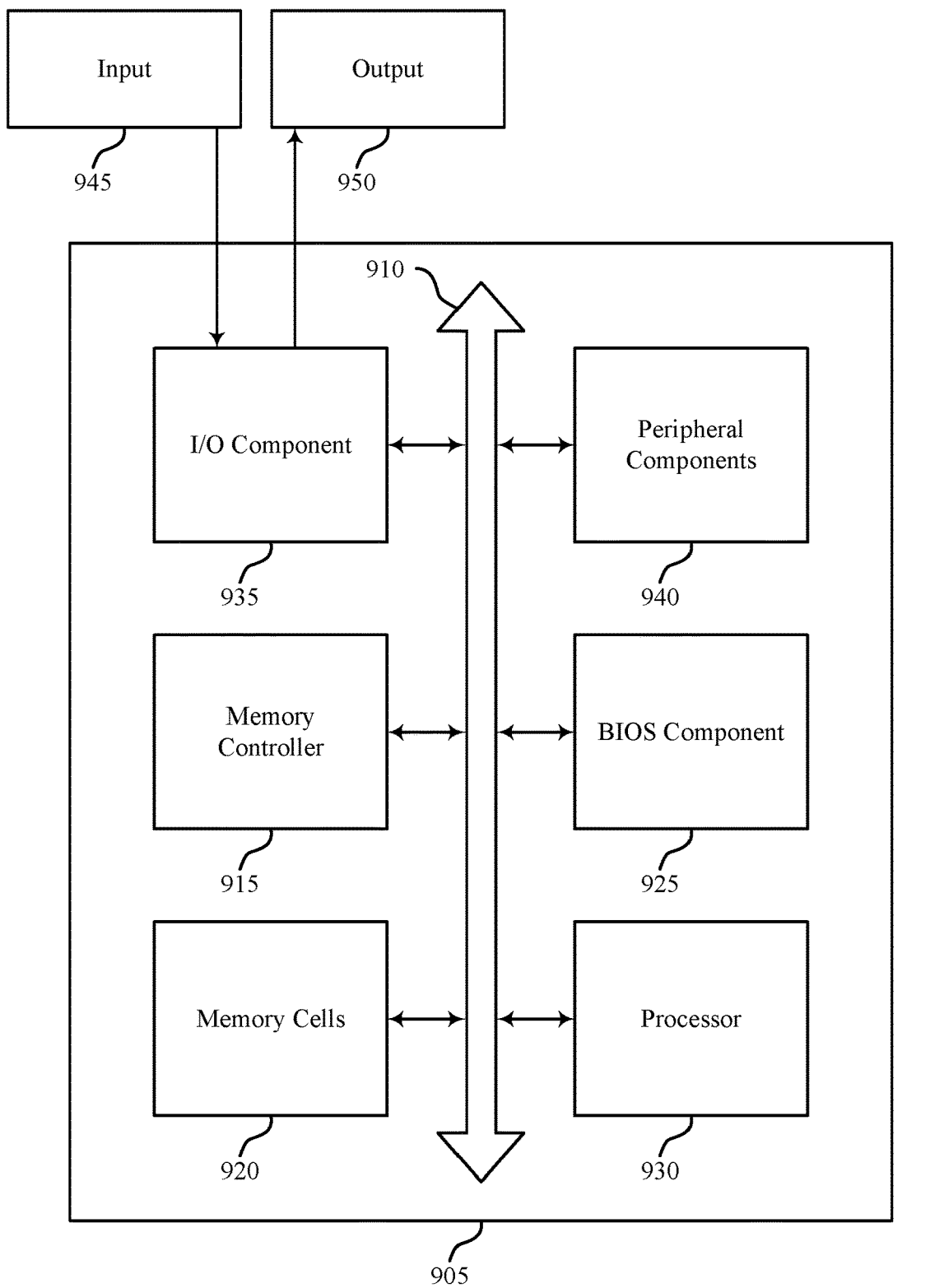
FIG. 9 shows a diagram of a system including a device that may support self-referencing sensing schemes with coupling capacitance in accordance with various embodiments of the present disclosure.

FIG. 9 shows a diagram of a system 900 including a device 905 that may support sensing schemes for accessing memory cells in accordance with various embodiments of the present disclosure. Device 905 may be an example of or include the components of memory device 100 as described above, e.g., with reference to FIG. 1. Device 905 may include components for bi-directional communications including components for transmitting and receiving communications, including memory controller 915, memory cells 920, basic input/output system (BIOS) component 925, processor 930, I/O component 935, and peripheral components 940. These components may be in electronic communication via one or more busses (e.g., bus 910).

Memory controller 915 may operate one or more memory cells as described herein. Specifically, memory controller 915 may be configured to support the described sensing schemes for accessing memory cells. In some cases, memory controller 915 may include a row decoder, column decoder, or both, as described with reference to FIG. 1 (not shown).

Memory cells 920 may be an example of memory cells 105 or 910 described with reference to FIGS. 1 through 6B and 9, and may store information (e.g., in the form of a logical state) as described herein.

BIOS component 925 be a software component that includes BIOS operated as firmware, which may initialize and run various hardware components. BIOS component 925 may also manage data flow between a processor and various other components, such as peripheral components, I/O control components, and others. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting self-referencing sensing schemes for accessing memory cells).

I/O component 935 may manage input and output signals for device 905. I/O component 935 may also manage peripherals not integrated into device 905. In some cases, I/O component 935 may represent a physical connection or port to an external peripheral. In some cases, I/O component 935 may utilize an operating system such as iOS®, ANDROID®, MS-DOS®, MS-WINDOWS®, OS/2®, UNIX®, LINUX®, or another known operating system. In other cases, I/O component 935 may represent or interact with a modem, a keyboard, a mouse, a touchscreen, or a similar device. In some cases, I/O component 935 may be implemented as part of a processor. In some cases, a user may interact with device 905 via I/O component 935 or via hardware components controlled by I/O component 935. The I/O component 935 may support accessing the memory cells 920, including receiving information associated with the sensed logic state of one or more of the memory cells 920, or providing information associated with writing a logic state of one or more of the memory cells 920.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O component 935, and may interact with device 905 via a peripheral component 940.

Output 950 may represent a device or signal external to device 905 configured to receive output from device 905 or any of its components. Examples of output 950 may include a display, audio speakers, a printing device, another processor or printed circuit board, or other devices. In some cases, output 950 may be a peripheral element that interfaces with device 905 via peripheral component(s) 940. In some cases, output 950 may be managed by I/O component 935.

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or element of such a device.

Figure 10:
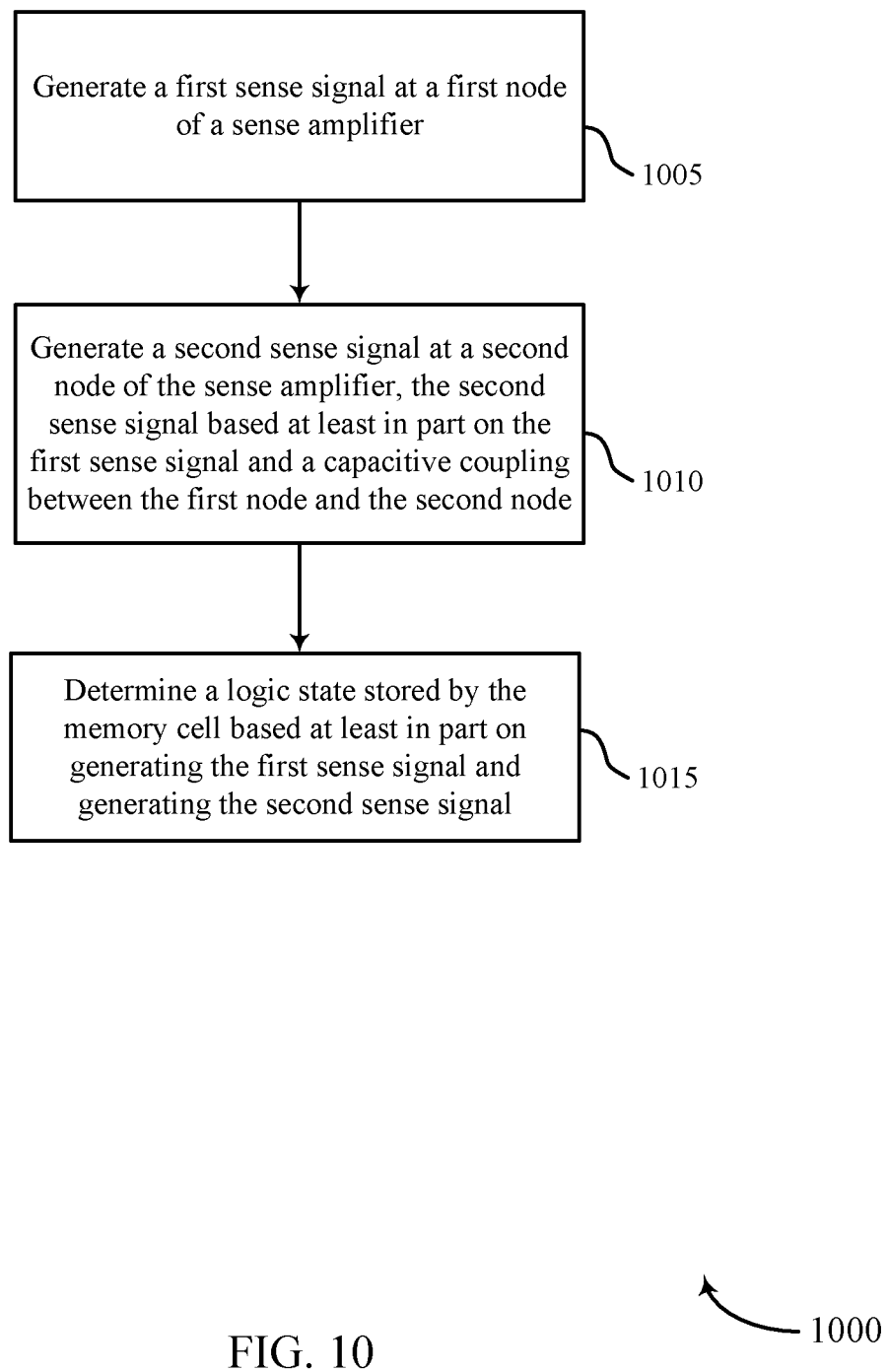
FIG. 10 shows a flowchart illustrating a method that may support self-referencing sensing schemes with coupling capacitance in accordance with various embodiments of the present disclosure.

FIG. 10 shows a flowchart illustrating a method 1000 that may support self-referencing sensing schemes with coupling capacitance in accordance with various embodiments of the present disclosure. The operations of method 1000 may be implemented by memory device 100, circuit 200, circuit 400, circuit 500, memory device 705, system 900 or their components as described herein. For example, operations of method 1000 may be performed at least in part by a memory controller as described with reference to FIGS. 1 through 9. In some examples, a memory device may execute a set of codes to control the functional elements of the device (e.g., voltage supplies, logical signals, transistors, amplifiers, switching components, or selection components) to perform the functions described below. Additionally or alternatively, the memory device may perform some or all of the functions described below using special-purpose hardware.

At 1005 the memory device may generate a first sense signal at a first node of a sense amplifier. The first sense signal may be based at least in part on a first access operation of a memory cell. In some examples the first node of the sense amplifier may be coupled with a memory cell at 1005. In some examples, generating the first sense signal includes building a first charge along an access line that is coupled between the memory cell and the sense amplifier. The first charge may be based at least in part on a charge stored at the memory cell, and may correspond to a logic state stored by the memory cell. The operations of 1005 may be performed according to the methods and apparatuses described with reference to FIGS. 1 through 9. In various examples, some or all of the operations of 1005 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

At 1010 the memory device may generate a second sense signal at a second node of the sense amplifier. The second sense signal may be based at least in part on a second access operation of the memory cell. In some examples, the second node of the sense amplifier may be coupled with the memory cell at 1010. The second sense signal may be based at least in part on the first sense signal and a capacitive coupling between the first node of the sense amplifier and the second node of the sense amplifier. In some examples, generating the second sense signal includes building a second charge along an access line that is coupled between the memory cell and the sense amplifier. The second charge may be based at least in part on a charge stored at the memory cell, and may correspond to a reference state stored by the memory cell. The operations of 1010 may be performed according to the methods and apparatuses described with reference to FIGS. 1 through 9. In various examples, some or all of the operations of 1010 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

At 1015 the memory device may determine a logic state stored by the memory cell based at least in part on generating the first sense signal and generating the second sense signal. In some examples, determining the logic state includes comparing a voltage of the first node of the sense amplifier with a voltage of the second node of the sense amplifier. The operations of 1015 may be performed according to the methods and apparatuses described with reference to FIGS. 1 through 9. In various examples, some or all of the operations of 1015 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

Figure 11:
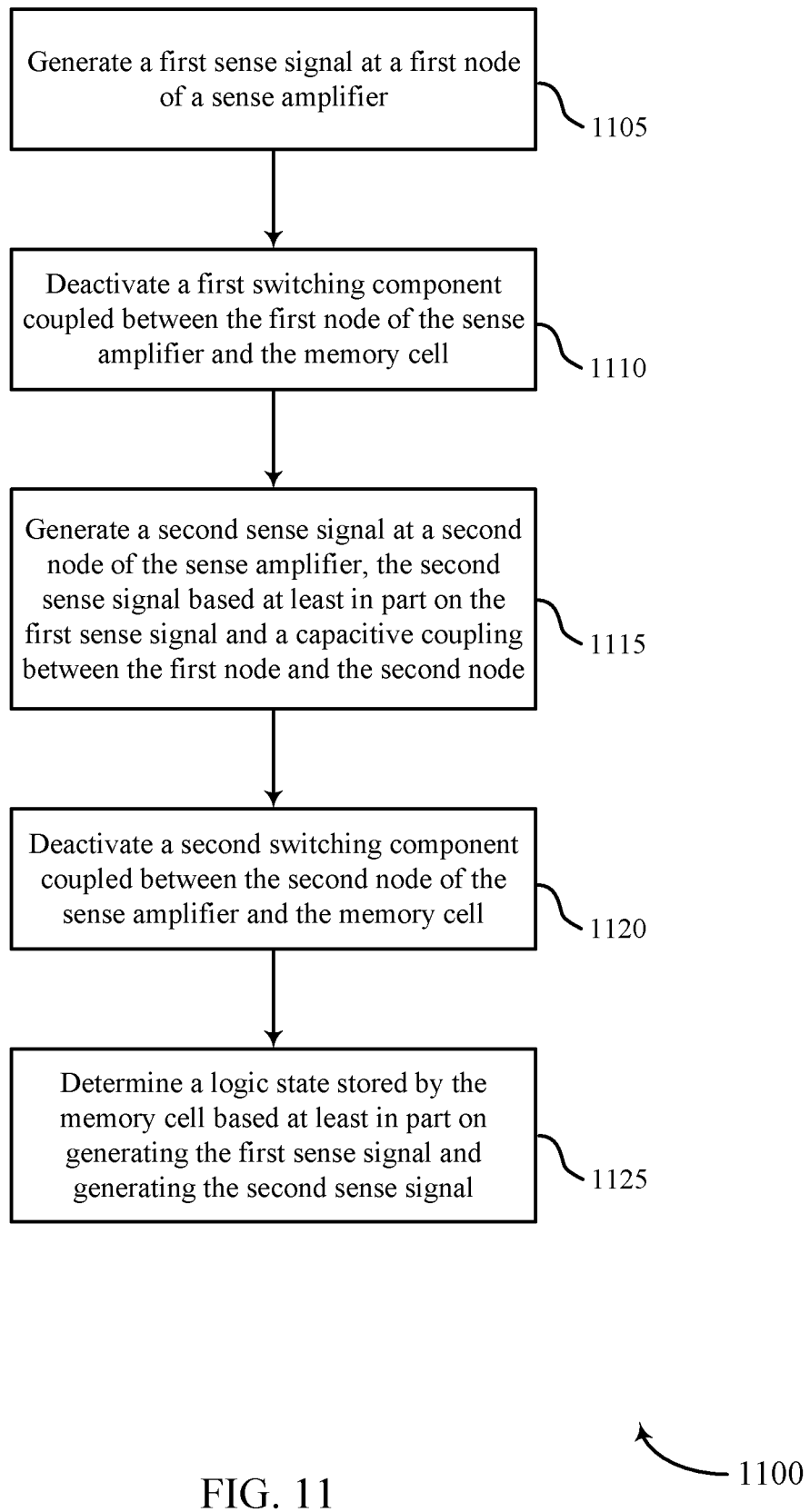
FIG. 11 shows a flowchart illustrating a method that may support self-referencing sensing schemes with coupling capacitance in accordance with various embodiments of the present disclosure.

FIG. 11 shows a flowchart illustrating a method 1100 that may support sensing schemes for accessing memory cells in accordance with various embodiments of the present disclosure. The operations of method 1100 may be implemented by memory device 100, circuit 200, circuit 400, circuit 500, memory device 705, system 900 or their components as described herein. For example, operations of method 1100 may be performed at least in part by a memory controller as described with reference to FIGS. 1 through 9. In some examples, a memory device may execute a set of codes to control the functional elements of the device (e.g., voltage supplies, logical signals, transistors, amplifiers, switching components, or selection components) to perform the functions described below. Additionally or alternatively, the memory device may perform some or all of the functions described below using special-purpose hardware.

At 1105 the memory device may generate a first sense signal at a first node of a sense amplifier. The first sense signal may be based at least in part on a first access operation of a memory cell. In some examples the first node of the sense amplifier may be coupled with a memory cell at 1105. For example, generating the first sense signal may include activating a first switching component that is coupled between the first node of the sense amplifier and the memory cell, the first switching component configured to selectively couple the first node of the sense amplifier and the memory cell. In some examples, generating the first sense signal includes building a first charge along an access line that is coupled between the memory cell and the sense amplifier. The first charge may be based at least in part on a charge stored at the memory cell, and may correspond to a logic state stored by the memory cell. The operations of 1105 may be performed according to the methods and apparatuses described with reference to FIGS. 1 through 9. In various examples, some or all of the operations of 1105 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

At 1110 the memory device may deactivate the first switching component coupled between the first node of the sense amplifier and the memory cell after generating the first sense signal. The operations of 1110 may be performed according to the methods and apparatuses described with reference to FIGS. 1 through 9. In various examples, some or all of the operations of 1110 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

At 1115 the memory device may generate a second sense signal at a second node of the sense amplifier. The second sense signal may be based at least in part on a second access operation of the memory cell. In some examples, the second node of the sense amplifier may be coupled with the memory cell at 1115. For example, generating the second sense signal may include activating a second switching component that is coupled between the second node of the sense amplifier and the memory cell, the second switching component configured to selectively couple the second node of the sense amplifier and the memory cell. The second sense signal may be based at least in part on the first sense signal and a capacitive coupling between the first node of the sense amplifier and the second node of the sense amplifier. In some examples, generating the second sense signal includes building a second charge along an access line that is coupled between the memory cell and the sense amplifier. The second charge may be based at least in part on a charge stored at the memory cell, and may correspond to a reference state stored by the memory cell. The operations of 1010 may be performed according to the methods and apparatuses described with reference to FIGS. 1 through 9. In various examples, some or all of the operations of 1010 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

At 1120 the memory device may deactivate the second switching component after generating the second sense signal. The operations of 1120 may be performed according to the methods and apparatuses described with reference to FIGS. 1 through 9. In various examples, some or all of the operations of 1120 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

At 1125 the memory device may determine a logic state stored by the memory cell based at least in part on generating the first sense signal and generating the second sense signal. In some examples, determining the logic state includes comparing a voltage of the first node of the sense amplifier with a voltage of the second node of the sense amplifier. The operations of 1125 may be performed according to the methods and apparatuses described with reference to FIGS. 1 through 9. In various examples, some or all of the operations of 1125 may be performed by a sense component (e.g., sense components 130 or 935 described with reference to FIGS. 1 through 9), a memory controller (e.g., memory controllers 150, 715, 815, or 915 described with reference to FIGS. 1 through 9), or one or more portions thereof.

It should be noted that the methods described above describe possible implementations, and that the operations and the steps may be rearranged or otherwise modified and that other implementations are possible. Further, examples from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open or closed).

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

As used herein, the term "terminal" need not suggest a physical boundary or connection point of a circuit element. Rather, "terminal" may refer to a reference point of a circuit relevant to the circuit element, which may also be referred to as a "node" or "reference point."

The term "layer" used herein refers to a stratum or sheet of a geometrical structure, each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory device 100, circuit 200, circuit 400, and circuit 500, described with reference to FIGS. 1, 2, 4, and 5, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a memory cell;
    a sense component comprising a first node, a second node, and a capacitor coupling the first node with the second node;
    an access line between the memory cell and the sense component; and
    a controller in electronic communication with the sense component and the memory cell, wherein the controller is operable to cause the apparatus to:
        activate a first switching component between the memory cell and the access line;
        activate a second switching component between the access line and the first node after activating the first switching component to generate a first sense signal;
        deactivate the second switching component after activating the second switching component;
        activate a third switching component between the access line and the second node after deactivating the second switching component to generate a second sense signal that is based at least in part on the first sense signal and the capacitor coupling the first node with the second node; and
        determine a logic state stored by the memory cell based at least in part on generating the first sense signal and generating the second sense signal.

2. The apparatus of claim 1, further comprising:
    a second capacitor coupled with the access line; and
    a voltage source configured to be selectively coupled with the access line.

3. The apparatus of claim 2, wherein the controller is operable to cause the apparatus to:
    precharge the second capacitor based at least in part on the voltage source before activating the first switching component; and
    precharge the second capacitor using the voltage source after deactivating the second switching component and before activating the third switching component.

4. The apparatus of claim 2, further comprising:
    a variable voltage source coupled with the access line via the second capacitor.

5. The apparatus of claim 4, wherein the controller is operable to cause the apparatus to:
    bias the access line based at least in part on the variable voltage source before activating the first switching component; and
    bias the access line based at least in part on the variable voltage source after deactivating the second switching component and before activating the third switching component.

6. The apparatus of claim 1, wherein the access line comprises a charge transfer sensing amplifier between the memory cell and the sense component.

7. The apparatus of claim 1, further comprising:
    a transistor configured to control a voltage of the access line based at least in part on an amount of charge transfer with the memory cell during an access operation.

8. The apparatus of claim 1, wherein the memory cell comprises a capacitive memory element.

9. The apparatus of claim 1, wherein the controller is operable to cause the apparatus to:
    deactivate the first switching component after activating the first switching component; and
    activate the first switching component after deactivating the first switching component and before determining the logic state.

10. The apparatus of claim 1, wherein determining the logic state stored by the memory cell comprises:
    comparing a voltage of the first node of the sense component with a voltage of the second node of the sense component.

11. The apparatus of claim 1, wherein generating the second sense signal at the second node of the sense component causes a change in voltage at the first node of the sense component that is based at least in part on the capacitor coupling the first node with the second node.

12. A method, comprising:
    activating a first switching component between a memory cell and an access line;
    activating a second switching component between the access line and a first node of a sense component to generate a first sense signal;
    deactivating the second switching component between the access line and the first node of the sense component;
    activating a third switching component between the access line and a second node of the sense component to generate a second sense signal that is based at least in part on the first sense signal and a capacitor coupling the first node of the sense component with the second node of the sense component; and
    determining a logic state stored by the memory cell based at least in part on generating the first sense signal and generating the second sense signal.

13. The method of claim 12, wherein:
    generating the first sense signal is based at least in part on a first charge sharing of the memory cell; and
    generating the second sense signal is based at least in part on a second charge sharing of the memory cell.

14. The method of claim 13, wherein:
    generating the first sense signal comprises generating, using a charge transfer sensing amplifier, a first voltage of the access line that is based at least in part on the first charge sharing of the memory cell; and
    generating the second sense signal comprises generating, using the charge transfer sensing amplifier, a second voltage of the access line that is based at least in part on the second charge sharing of the memory cell.

15. The method of claim 12, further comprising
performing a first precharging of a second capacitor that is coupled with the access line before activating the first switching component, wherein generating the first sense signal is based at least in part on the first precharging; and
performing a second precharging of the second capacitor after deactivating the second switching component and before activating the third switching component, wherein generating the second sense signal is based at least in part on the second precharging.

16. The method of claim 15, wherein the second capacitor is coupled with the access line via a first node of the second capacitor, the method further comprising:
performing a first voltage boosting of a second node of the second capacitor after performing the first precharging, wherein generating the first sense signal is based at least in part on the first voltage boosting; and
performing a second voltage boosting of the second node of the second capacitor after performing the second precharging, wherein generating the second sense signal is based at least in part on the second voltage boosting.

17. An apparatus, comprising:
a memory cell configured to be selectively coupled with an access line;
a sense amplifier comprising a first node, a second node, and a capacitor configured for a capacitive coupling between the first node with the second node;
a first switching component operable to selectively couple the first node with the access line; and
a second switching component operable to selectively couple the second node with the access line,
wherein the apparatus is operable to determine a logic state of the memory cell based at least in part on the capacitive coupling between the first node and the second node.

18. The apparatus of claim 17, further comprising:
a transistor configured to control a voltage of the access line based at least in part on an amount of charge transfer with the memory cell during an access operation.

19. The apparatus of claim 18, further comprising:
a voltage source configured to be selectively coupled with the access line between the sense amplifier and the transistor.

20. The apparatus of claim 17, further comprising:
a second capacitor coupled with the access line via a first node of the second capacitor; and
a variable voltage source coupled with the second capacitor via a second node of the second capacitor.

* * * * *